(12) United States Patent
Matsunuma

(10) Patent No.: US 8,878,121 B2
(45) Date of Patent: *Nov. 4, 2014

(54) SOLID-STATE IMAGING DEVICE WITH OVERFLOW DRAIN REGION AND CONTRACT THERETO IN DIFFERENT STACKED SUBSTRATES

(71) Applicant: Sony Corporation, Tokyo (JP)

(72) Inventor: Takeshi Matsunuma, Kumamoto (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/959,277

(22) Filed: Aug. 5, 2013

(65) Prior Publication Data

US 2013/0313616 A1 Nov. 28, 2013

Related U.S. Application Data

(63) Continuation of application No. 12/860,168, filed on Aug. 20, 2010, now Pat. No. 8,530,820.

(30) Foreign Application Priority Data

Aug. 28, 2009 (JP) ................................. 2009-198118

(51) Int. Cl.
  *H01L 31/00* (2006.01)
  *H01L 27/146* (2006.01)
  *H01L 27/148* (2006.01)

(52) U.S. Cl.
  CPC .... *H01L 27/14887* (2013.01); *H01L 27/14656* (2013.01); *H01L 27/14636* (2013.01); *H01L 27/14683* (2013.01); *H01L 27/14689* (2013.01); *H01L 27/14634* (2013.01); *H01L 27/14692* (2013.01); *H01L 27/1469* (2013.01); *H01L 27/14609* (2013.01)
  USPC ..................... 250/214.1; 250/208.1; 257/431; 257/445; 348/299; 348/314

(58) Field of Classification Search
  USPC ................. 250/214.1, 208.1, 214 R, 214 DC; 257/431, 432, 443, 444, 445, 446, 448, 257/458; 348/272, 281, 294, 297, 298, 299, 348/311, 314
  See application file for complete search history.

(56) References Cited

U.S. PATENT DOCUMENTS

| | | | | |
|---|---|---|---|---|
| 8,530,820 | B2 * | 9/2013 | Matsunuma | 250/214.1 |
| 2006/0022223 | A1 * | 2/2006 | Kumesawa | 257/225 |
| 2007/0108371 | A1 * | 5/2007 | Stevens et al. | 250/214.1 |
| 2008/0246063 | A1 * | 10/2008 | Liu et al. | 257/290 |
| 2008/0265296 | A1 * | 10/2008 | Uya | 257/292 |
| 2008/0265352 | A1 * | 10/2008 | Akiyoshi | 257/432 |

FOREIGN PATENT DOCUMENTS

| | | |
|---|---|---|
| JP | 2001-339057 | 12/2001 |
| JP | 2002-314061 | 10/2002 |

(Continued)

*Primary Examiner* — Francis M Legasse, Jr.
(74) *Attorney, Agent, or Firm* — Sheridan Ross P.C.

(57) ABSTRACT

A solid-state imaging device includes: a plurality of substrates stacked via a wiring layer or an insulation layer; a light sensing section that is formed in a substrate, of the plurality of substrates, disposed on a light incident side and that generates a signal charge in accordance with an amount of received light; and a contact portion that is connected to a non-light incident-surface side of the substrate in which the light sensing section is formed and that supplies a desired voltage to the substrate from a wire in a wiring layer disposed on a non-light incident side of the substrate.

14 Claims, 26 Drawing Sheets

(56) References Cited

FOREIGN PATENT DOCUMENTS

| JP | 2006-100620 | 4/2006 |
| JP | 2006-191081 | 7/2006 |
| JP | 2007-221134 | 8/2007 |
| JP | 2008-210846 | 9/2008 |
| JP | 2008-277511 | 11/2008 |
| JP | 2009-170944 | 7/2009 |

* cited by examiner

SOLID-STATE IMAGING DEVICE WITH OVERFLOW DRAIN REGION AND CONTRACT THERETO IN DIFFERENT STACKED SUBSTRATES

CROSS REFERENCES TO RELATED APPLICATIONS

This application is a continuation of U.S. patent application Ser. No. 12/860,168 filed Aug. 20, 2010, which claims the benefit of Japanese Patent Application No. 2009-198118 filed on Aug. 28, 2009, the entire contents of each of which are hereby incorporated by reference.

BACKGROUND OF THE INVENTION

1. Field of the Invention

The present invention relates to a solid-state imaging device, and in particular to a solid-state imaging device formed by stacking a plurality of substrates and a manufacturing method for the solid-state imaging device. The present invention also relates to an electronic device in which the solid-state imaging device is used.

2. Description of the Related Art

Solid-state imaging devices are roughly divided into charge-transfer solid-state imaging devices represented by CCD (Charge Coupled Device) image sensors and amplification solid-state imaging devices represented by CMOS (Complementary Metal Oxide Semiconductor) image sensors.

Each pixel forming a CCD solid-state imaging device is composed of a light sensing section that is formed by a photodiode and that generates a signal charge in response to received light, and a vertical transfer resistor in a CCD structure that transfers the signal charge generated by the light sensing section in the vertical direction. A vertical transfer resistor section is formed for each column of the light sensing section arranged two-dimensionally, for example. A horizontal transfer resistor in a CCD structure is provided in a stage subsequent to the vertical transfer resistor. An output circuit is provided in a stage subsequent to the horizontal transfer resistor. In the CCD solid-state imaging device configured as described above, the signal charge generated by the light sensing section is read out for each row by the vertical transfer resistor to be transferred in the vertical direction, and is then transferred horizontally by the horizontal transfer resistor to the output circuit. The signal charge transferred to the output circuit is amplified to be output as a pixel signal.

Each pixel forming a CMOS solid-state imaging device is composed of a light sensing section made of a photodiode, a floating diffusion node that reads out a signal charge generated by the light sensing section, and a plurality of MOS transistors. The plurality of MOS transistors include a transfer transistor, a reset transistor, an amplification transistor, and (as necessary) a selection transistor. Each MOS transistor is connected to a desired wiring layer, of a multiplicity of upper wiring layers. In the CMOS solid-state imaging device, the signal charge generated by and accumulated in the light sensing section is read out by the floating diffusion node for each pixel. Then, the signal charge read out by the floating diffusion node is amplified by the amplification transistor, and is selectively output as a pixel signal to a vertical signal line formed in the multiplicity of wiring layers by the selection transistor.

The size of the solid-state imaging devices has been reduced in recent years. For example, Japanese Unexamined Patent Application Publication No. 6-291355 discloses a solid-state imaging device with a stacked structure in which MOS transistors are formed in a single-crystalline silicon substrate and a TFT photosensor is formed on top of the single-crystalline silicon substrate on the light incident side via an insulation film. In the solid-state imaging device, the TFT photosensor and the MOS transistor are formed in different layers, which reduces the size of the device without decreasing the light reception area.

Manufacture of the solid-state imaging devices is subjected to a process constraint that only a low-temperature process is applicable after formation of wires. Therefore, in the solid-state imaging devices, it is necessary to first form impurity regions forming the light sensing section and the MOS transistors in a substrate by ion implantation, and to finally form wires to be connected to the substrate or the desired MOS transistors. In the solid-state imaging device with the stacked structure discussed above, also, contact portions and wires to be connected to each layer are formed after each layer in which desired impurity regions are formed is stacked.

For example, in order to implement an electronic shutter function for resetting a signal charge accumulated in the light sensing section in the solid-state imaging device with the stacked structure, it is necessary to form wires and contact portions necessary for the electronic shutter function on top of the light reception surface because of the process temperature constraint. In this way, however, the light reception area may be decreased with the wires and the contact portions formed on top of the light reception surface, although the size of the device may be reduced by employing a three-dimensional structure. Therefore, it is necessary to equivalently increase the pixel area in order to maintain the light reception area, as a result of which the size of the device may not be reduced.

SUMMARY OF THE INVENTION

In view of the foregoing, it is desirable to provide a solid-state imaging device, the size of which is reduced without decreasing the light reception area by employing a three-dimensional structure, in which a desired potential may be supplied to a substrate in which a light sensing section is formed, and which may be implemented in spite of a process constraint, and to provide a manufacturing method for the solid-state imaging device. It is also desirable to provide an electronic device in which the solid-state imaging device is used.

According to a first embodiment of the present invention, there is provided a solid-state imaging device including: a plurality of substrates stacked via a wiring layer or an insulation layer; a light sensing section that is formed in a substrate, of the plurality of substrates, disposed on a light incident side and that generates a signal charge in accordance with an amount of received light; and a contact portion that is connected to a non-light incident-surface side of the substrate in which the light sensing section is formed and that supplies a desired voltage to the substrate from a wire in a wiring layer disposed on a non-light incident side of the substrate.

The solid-state imaging device according to the embodiment of the present invention has a three-dimensional structure in which the plurality of substrates are stacked via the wiring layer or the insulation layer. Also, the contact portion is connected to the non-light incident-surface side of the substrate in which the light sensing section is formed, and a desired voltage is supplied to the substrate via the contact portion from the wire in the wiring layer disposed on the non-light incident side of the substrate, which varies the voltage of the substrate.

According to a second embodiment of the present invention, there is provided a manufacturing method for a solid-state imaging device, including the steps of: stacking a plurality of substrates via a wiring layer or an insulation layer with a light sensing section formed in a substrate disposed on a light incident side, the light sensing section being configured to generate a signal charge in accordance with an amount of received light; and during the step of stacking the plurality of substrates, forming a contact portion that is connected to a non-light incident-surface side of the substrate in which the light sensing section is formed and that supplies a desired voltage to the substrate.

In the manufacturing method for a solid-state imaging device according to the embodiment of the present invention, the contact portion, which is connected to the non-light incident-surface side of the substrate in which the light sensing section is formed, is formed during the step of stacking the plurality of substrates. Therefore, it is not necessary to form the contact portion, which supplies a predetermined voltage to the substrate in which the light sensing section is formed, after the light sensing section is formed in the substrate disposed on the light incident side. Therefore, it is possible to save forming extra wires on the substrate disposed on the light incident side, which secures a large light reception area.

According to a third embodiment of the present invention, there is provided an electronic device including: an optical lens; a solid-state imaging device on which light collected by the optical lens is incident; and a signal processing circuit that processes an output signal output from the solid-state imaging device. The solid-state imaging device used in the electronic device according to the embodiment of the present invention includes, as discussed above: a plurality of substrates stacked via a wiring layer or an insulation layer; a light sensing section that is formed in a substrate, of the plurality of substrates, disposed on a light incident side and that generates a signal charge in accordance with an amount of received light; and a contact portion that is connected to a non-light incident-surface side of the substrate in which the light sensing section is formed and that supplies a desired voltage to the substrate from a wire in a wiring layer disposed on a non-light incident side of the substrate.

According to the present invention, it is possible to supply a desired potential to a substrate in which a light sensing section is formed without increasing the pixel area or decreasing the light reception area in a solid-state imaging device with a three-dimensional structure in which a plurality of substrates are stacked. Also, according the present invention, it is possible to manufacture a solid-state imaging device without significant difficulty in spite of a process constraint, which makes it possible to avoid deterioration of pixel characteristics.

DESCRIPTION OF THE PREFERRED EMBODIMENTS

A solid-state imaging device, a manufacturing method for the solid-state imaging device, and an electronic device according to embodiments of the present invention will be described below with reference to FIGS. 1 to 40. The embodiments of the present invention will be described in the following order. It should be noted that the present invention is not limited to the embodiments given below.
1. First Embodiment: Solid-State Imaging Device
    1-1. Overall Configuration of Solid-State Imaging Device
    1-2 Cross-Sectional Configuration of Main Portion
    1-3. Manufacturing Method
2. Second Embodiment: Solid-State Imaging Device
    2-1 Cross-Sectional Configuration of Main Portion
    2-2. Manufacturing Method
3. Third Embodiment: Solid-State Imaging Device
    3-1 Cross-Sectional Configuration of Main Portion
    3-2. Manufacturing Method
4. Fourth Embodiment: Solid-State Imaging Device
    4-1 Cross-Sectional Configuration of Main Portion
    4-2. Manufacturing Method
5. Fifth Embodiment: Solid-State Imaging Device
    5-1 Cross-Sectional Configuration of Main Portion
6. Sixth Embodiment: Solid-State Imaging Device
    6-1. Overall Configuration of Solid-State Imaging Device
    6-2 Cross-Sectional Configuration of Main Portion
    6-3. Manufacturing Method
7. Seventh Embodiment: Electronic Device
    <1. First Embodiment: CMOS Solid-State Imaging Device>
    [1-1. Overall Configuration of Solid-State Imaging Device]

Figure 1:
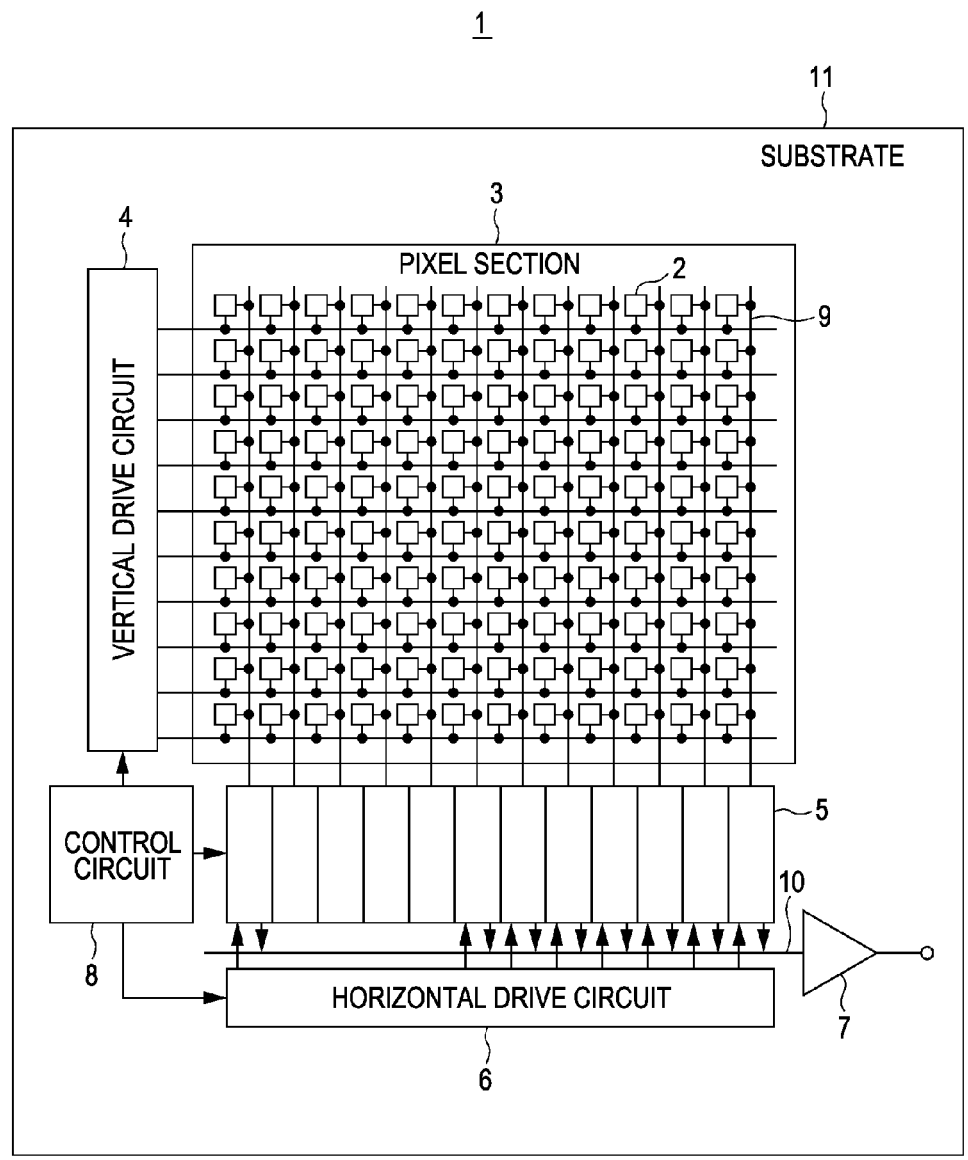
FIG. 1 shows a schematic overall configuration of a CMOS solid-state imaging device according to a first embodiment of the present invention.

FIG. 1 shows a schematic overall configuration of a CMOS solid-state imaging device according to a first embodiment of the present invention.

A solid-state imaging device 1 according to the embodiment includes a pixel section 3 formed by a plurality of pixels 2 arranged on a substrate 11 made of silicon, a vertical drive circuit 4, column signal processing circuits 5, a horizontal drive circuit 6, an output circuit 7, a control circuit 8, and so forth.

Each pixel 2 is composed of a light sensing section made of a photodiode and a plurality of MOS transistors. The plurality of pixels 2 are arranged regularly in a two-dimensional array on the substrate 11. Each pixel 2 may include four MOS transistors, namely a transfer transistor, a reset transistor, a selection transistor, and an amplification transistor, or may include three transistors excluding the selection transistor.

The pixel section 3 is formed by the plurality of pixels 2 arranged regularly in a two-dimensional array. The pixel section 3 is composed of an effective pixel region in which light is actually received and converted into a signal charge through photoelectric conversion and the signal charge is amplified, read out, and output to the column signal processing circuits 5, and a reference black pixel region (not shown) that outputs an optical black level serving as a reference black level. The reference black pixel region is normally formed at the outer periphery of the effective pixel region.

The control circuit 8 generates a clock signal, a control signal, and so forth serving as a reference for operation of the vertical drive circuit 4, the column signal processing circuits 5, the horizontal drive circuit 6, and so forth on the basis of a vertical synchronizing signal, a horizontal synchronizing signal, and a master clock signal. The clock signal, the control signal, and so forth generated by the control circuit 8 are input to the vertical drive circuit 4, the column signal processing circuits 5, the horizontal drive circuit 6, and so forth.

The vertical drive circuit 4 is formed by a shift register, for example, and sequentially selects and scans the pixels 2 of the pixel section 3 row by row in the vertical direction. The vertical drive circuit 4 then supplies a pixel signal based on the signal charge generated by the photodiode of each pixel 2 in accordance with the amount of received light to the column signal processing circuits 5 through a vertical signal line.

The column signal processing circuits 5 are disposed for each column of the pixels 2, for example, and perform signal processing, such as noise reduction and signal amplification, on a signal output from the pixels 2 for each row using a signal from the reference black pixel region (formed around the effective pixel region, although not shown) for each pixel column. A horizontal selection switch (not shown) is provided between an output stage of the column signal processing circuits 5 and a horizontal signal line 10.

The horizontal drive circuit 6 is formed by a shift register, for example, and sequentially outputs horizontal scanning pulses to sequentially select the column signal processing circuits 5 and cause the column signal processing circuits 5 to output the pixel signal to the horizontal signal line 10.

The output circuit 7 performs signal processing on the signals sequentially supplied from the column signal processing circuits 5 through the horizontal signal line 10 to output the processed signals.

Figure 2:
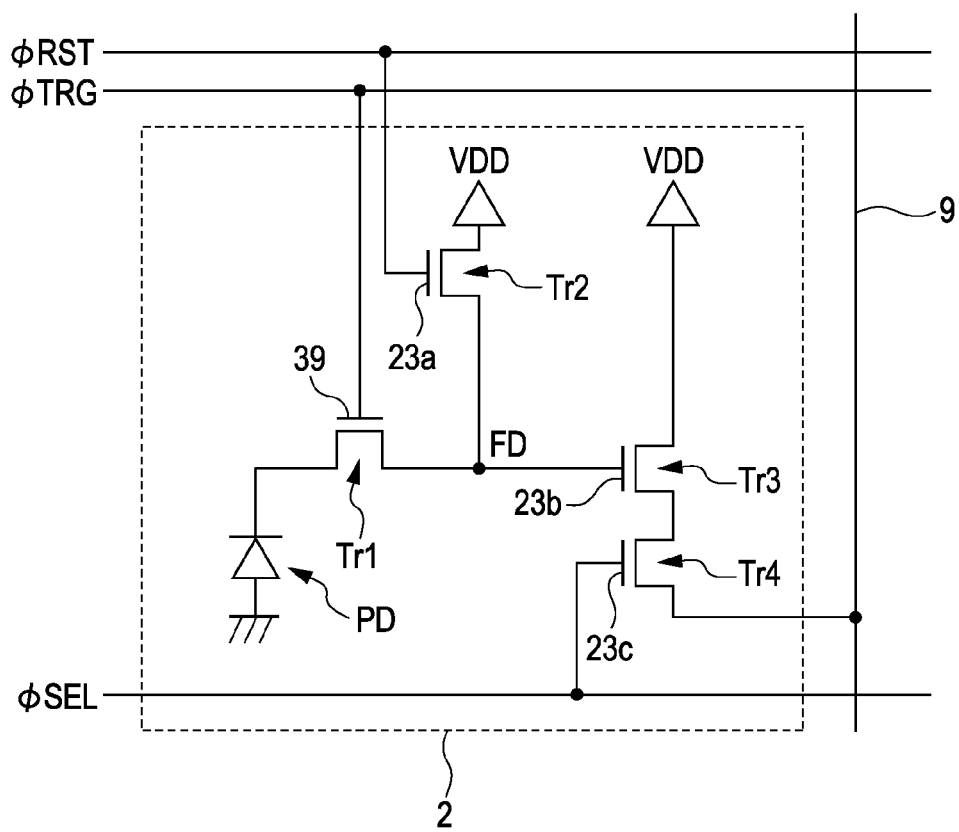
FIG. 2 shows an exemplary equivalent circuit of a unit pixel in the solid-state imaging device of FIG. 1.

FIG. 2 shows an exemplary equivalent circuit of a unit pixel in the solid-state imaging device according to the embodiment. A unit pixel 2 in the solid-state imaging device according to the embodiment includes one light sensing section PD serving as a photoelectric conversion element and four pixel transistors, namely a transfer transistor Tr1, a reset transistor Tr2, an amplification transistor Tr3, and a selection transistor Tr4. In the embodiment, n-channel MOS transistors are used as the pixel transistors Tr1 to Tr4.

The source of the transfer transistor Tr1 is connected to the cathode of the light sensing section PD made of a photodiode. The drain of the transfer transistor Tr1 is connected to a floating diffusion node FD. A transfer wire that supplies a transfer pulse $\phi$TRG is connected to a gate electrode 39 between the source and the drain of the transfer transistor Tr1. The signal charge (in the embodiment, an electron) generated through photoelectric conversion performed by the light sensing section PD and accumulated in the light sensing section PD is transferred to the floating diffusion node FD by applying the transfer pulse $\phi$TRG to the gate electrode 39 of the transfer transistor Tr1.

The drain of the reset transistor Tr2 is connected to a power source voltage VDD. The source of the reset transistor Tr2 is connected to the floating diffusion node FD. A reset wire that supplies a reset pulse $\phi$RST is connected to a gate electrode 23a between the source and the drain of the reset transistor Tr2. Prior to the transfer of the signal charge from the light sensing section PD to the floating diffusion node FD, the reset pulse $\phi$RST is applied to the gate electrode 23a of the reset transistor Tr2. This causes the potential of the floating diffusion node FD to be reset by the power source voltage VDD to a VDD level.

The drain of the amplification transistor Tr3 is connected to a power source voltage VDD. The source of the amplification transistor Tr3 is connected to the drain of the selection transistor Tr4. A gate electrode 23b between the source and the drain of the amplification transistor Tr3 is connected to the floating diffusion node FD. The amplification transistor Tr3 forms a source follower circuit for which the power source voltage VDD serves as a load, and outputs a pixel signal in accordance with variations in potential of the floating diffusion node FD.

The drain of the selection transistor Tr4 is connected to the source of the amplification transistor Tr3. The source of the selection transistor Tr4 is connected to the vertical signal line 9. A selection wire that supplies a selection pulse $\phi$SEL is connected to a gate electrode 23c between the source and the drain of the selection transistor Tr4. The pixel signal amplified by the amplification transistor Tr3 is output to the vertical signal line 9 by supplying the selection pulse $\phi$SEL to the gate electrode 23c for each pixel.

Although four pixel transistors are used in the example of FIG. 2, three pixel transistors excluding the selection transistor Tr4 may rather be used.

In the solid-state imaging device 1 configured as described above, when a transfer pulse $\phi$TRG is supplied to the gate electrode 39, a signal charge accumulated in the light sensing section PD is read out and output to the floating diffusion node FD by the transfer transistor Tr1. When the signal charge is output, the potential of the floating diffusion node FD is varied, and variations in potential are transmitted to the gate electrode 23b. The potential supplied to the gate electrode 23b is amplified by the amplification transistor Tr3, and selectively output as a pixel signal to the vertical signal line 9 by the selection transistor Tr4. When the reset pulse $\phi$RST is supplied to the gate electrode 23a, the signal charge output to the floating diffusion node FD is reset to the same potential as the potential around the power source voltage VDD by the reset transistor Tr2.

Thereafter, the pixel signal output to the vertical signal line 9 is output via the column signal processing circuit 5, the horizontal signal line 10, and the output circuit 7.

[1-2 Cross-Sectional Configuration of Main Portion]

Figure 3:
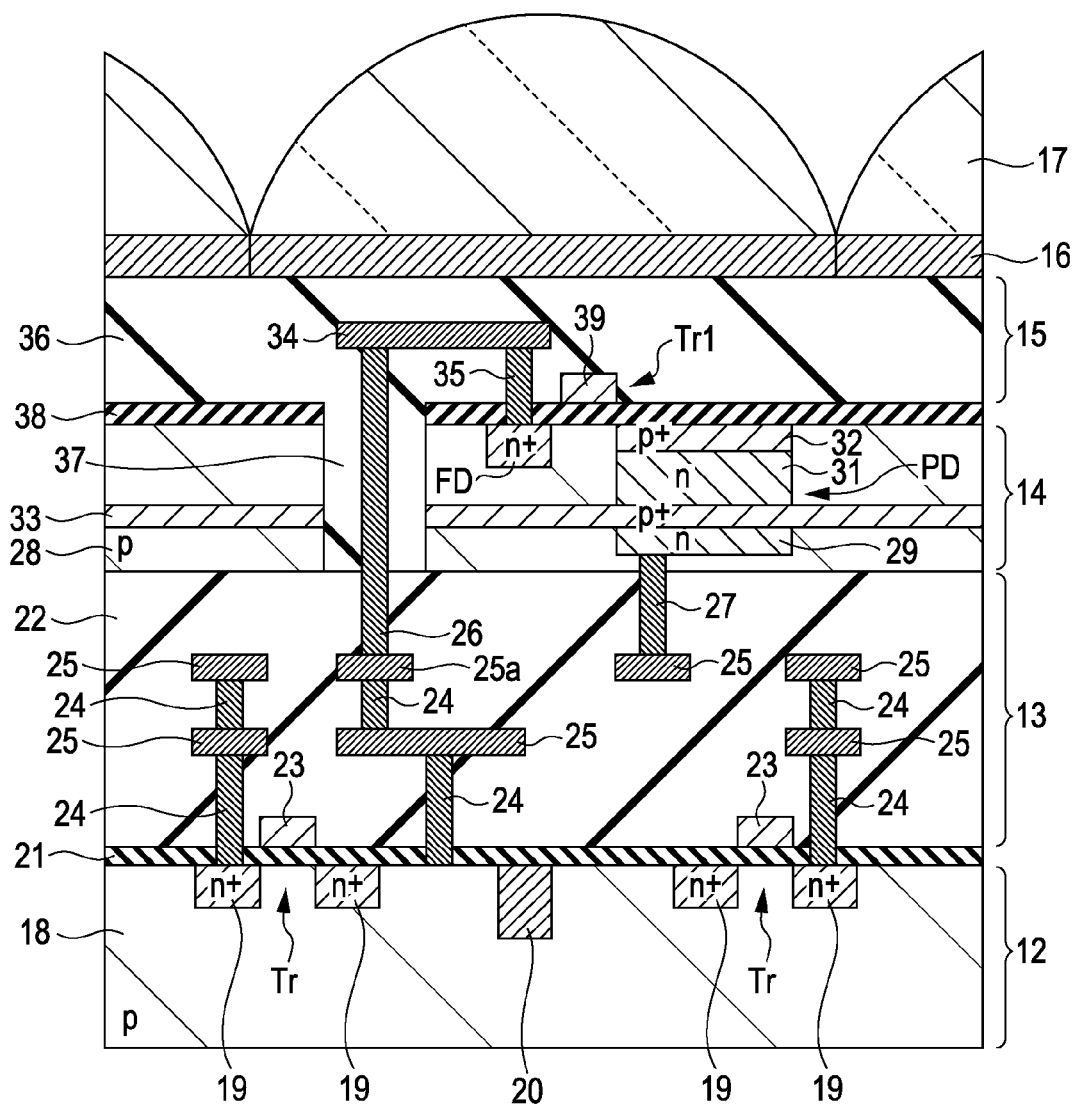
FIG. 3 is a cross-sectional view showing a schematic configuration of a pixel section of the solid-state imaging device according to the first embodiment.

FIG. 3 is a cross-sectional view showing a schematic configuration of the pixel section 3 of the solid-state imaging device 1 according to the embodiment. FIG. 3 shows a cross section generally corresponding to one pixel.

As shown in FIG. 3, the solid-state imaging device 1 according to the embodiment has a three-dimensional structure in which a first substrate 12, a first wiring layer 13, a second substrate 14, a second wiring layer 15, a color filter layer 16, and an on-chip microlens 17 are stacked three-dimensionally in this order toward the light incident side.

The first substrate 12 is formed by a first conductive-type, for example p-type, semiconductor substrate 18. Source/drain regions 19 forming desired pixel transistors Tr are formed in the first substrate 12 on the first wiring layer 13 side. In the embodiment, MOS transistors other than the transfer transistor Tr1, of the transfer transistor Tr1, the reset transistor Tr2, the amplification transistor Tr3, and the selection transistor Tr4 discussed above, are formed in the first substrate 12 as the pixel transistors Tr. Hereinafter, the MOS transistors formed in the first substrate 12 are collectively referred to as "pixel transistors Tr".

The source/drain regions 19 formed in the first substrate 12 are formed by regions heavily doped with second conductive-type, for example n-type, impurities by ion implantation.

An element separation region 20 that separates adjacent pixels from each other is formed in the first substrate 12 on the first wiring layer 13 side. The element separation region 20 is formed by an STI (Shallow Trench Isolation) process in which an insulation layer is embedded in a trench portion formed in the first substrate 12.

The first wiring layer 13 includes gate electrodes 23 formed on top of the first substrate 12 via a gate insulation film 21 and forming the pixel transistors Tr, and wires 25 in a plurality of layers (in the embodiment, two layers) stacked above the gate electrode 23 via an interlayer insulation film 22. Contact portions 24 are respectively formed in the interlayer insulation film 22 to connect between the wires 25, between the wires 25 and the first substrate 12, and between the wires 25 and the desired gate electrodes 23.

The second substrate 14 is formed by a p-type semiconductor substrate 28, and is formed to be stacked on top of the first wiring layer 13 (on the light incident side). A light sensing section PD made of a photodiode and a floating diffusion node FD which reads out a signal charge generated by and accumulated in the light sensing section PD are formed in the second substrate 14 on the front-surface side (light incident-surface side). The light sensing section PD is composed of a dark-current suppression region 32 made of a p-type heavily doped impurity region formed in the second substrate 14 on the front-most surface, and an n-type impurity region 31 formed on the bottom of the dark-current suppression region 32. The floating diffusion node FD is formed by an n-type heavily doped impurity region, and is formed in a region adjacent to the light sensing section PD. Further, an overflow barrier 33 made of a p-type heavily doped impurity region is formed on the bottom of the n-type impurity region 31 all over the second substrate 14. An overflow drain region 29 made of an n-type impurity region is formed on the bottom of the overflow barrier 33 in a region equivalent to the light sensing section PD.

In the solid-state imaging device according to the embodiment, the light sensing section PD is mainly formed by a pn junction between the dark-current suppression region 32 and the n-type impurity region 31 and a pn junction between the n-type impurity region 31 and the p-type semiconductor substrate 28 (the second substrate 14). In the dark-current suppression region 32, a charge produced on the light incident surface of the second substrate 14 as a dark-current component is recombined with a positive hole provided in the dark-current suppression region 32 to suppress a dark current.

In the second substrate 14 according to the embodiment, a pnpn junction is formed from the front-surface side (light incident-surface side) to the back-surface side (non-light incident-surface side) to form a vertical overflow structure in the substrate. The thus formed vertical overflow structure allows an excess signal charge overflowing from the light sensing section PD to be discharged through the overflow barrier 33 into the overflow drain region 29.

A contact portion 27 extending from the wire 25 in the first wiring layer 13 is connected to the back-surface side of the second substrate 14. In the embodiment, the upper end of the contact portion 27 is formed to be connected to the overflow drain region 29 in the second substrate 14. A desired potential (hereinafter referred to as an "electronic shutter pulse") is supplied from the wire 25 in the first wiring layer 13 to the overflow drain region 29 via the contact portion 27 to vary the potential of the overflow barrier 33. This allows the signal charge accumulated in the light sensing section PD to overflow into the overflow drain region 29. That is, the electronic shutter function is provided by the vertical overflow structure formed in the second substrate 14 and the electronic shutter pulse supplied via the contact portion 27.

In the embodiment, the vertical overflow structure is formed for each pixel. However, a vertical overflow structure that may be commonly used by all the pixels may be provided. In such a case, the overflow drain region 29 may be formed in a region equivalent to the pixel section, and an electronic shutter pulse may be supplied to the overflow drain region 29 via a contact portion to allow signal charges to overflow for all the pixels at the same time.

The second wiring layer 15 includes a gate electrode 39 formed on top of the second substrate 14 via a gate insulation film 38 and forming the transfer transistor Tr1, and a wire 34 formed above the gate electrode 39 via an interlayer insulation film 36. The wire 34 is connected to the transfer transistor Tr1 (in FIG. 3, the floating diffusion node FD) via a contact portion 35. The wire 34 is connected to a wire 25a formed in the first wiring layer 13 by a contact portion 26 formed in an intra-substrate insulation layer 37 formed to penetrate through the second substrate 14. With the wire 25a in the first wiring layer 13 and the wire 34 in the second wiring layer 15 connected by the contact portion 26, the potential of the floating diffusion node FD is supplied to the pixel transistors Tr formed in the first substrate 12, for example.

The color filter layer 16 for red color (R), green color (G), and blue color (B) is formed on top of the second wiring layer 15 (on the light incident side). The on-chip microlens 17 is formed on top of the color filter layer 16.

In the thus configured solid-state imaging device 1, when an electronic shutter pulse is supplied to the overflow drain region 29 via the contact portion 27, the signal charge accumulated in the light sensing section PD flows into the overflow drain region 29. This causes the light sensing section PD to be reset once. After the light sensing section PD is reset, generation and accumulation of a signal charge is started again. When a desired transfer pulse ϕTRG is supplied to the gate electrode 39 of the transfer transistor Tr1, the signal charge accumulated in the light sensing section PD is read out and output to the floating diffusion node FD.

The potential of the floating diffusion node FD which has been varied when the signal charge is read out is supplied to the pixel transistor Tr formed in the first substrate 12 via the wire 34 in the second wiring layer 15 and the wires 25 in the first wiring layer 13. Thereafter, the pixel signal amplified by the desired pixel transistor Tr formed in the first substrate 12 is selectively output for each pixel.

In the solid-state imaging device 1 according to the embodiment, the first wiring layer 13 is formed on the back-surface side of the second substrate 14, and the contact portion 27 is connected to the overflow drain region 29 from the back-surface side of the second substrate 14. Therefore, it is not necessary to form a wire forming an electronic shutter in the second wiring layer 15 which is formed on top of the second substrate 14 on the light incident side. Therefore, an electronic shutter may be implemented without decreasing the light reception area or equivalently increasing the pixel area. In the embodiment of the present invention, the first substrate 12 and the second substrate 14 are stacked to provide a three-dimensional structure, and only the light sensing section PD and some of the pixel transistors (in the embodiment, the transfer transistor Tr1) are formed in the second substrate 14. This allows an increase in area of the light sensing section PD made of a photodiode, which improves the sensitivity. Also, the size of the device is reduced by adopting the three-dimensional structure.

[1-3. Manufacturing Method]

FIGS. 4 to 12 show respective steps of a manufacturing method for the solid-state imaging device 1 according to the embodiment. The manufacturing method for the solid-state imaging device 1 according to the embodiment will be described with reference to FIGS. 4 to 12.

Figure 4:
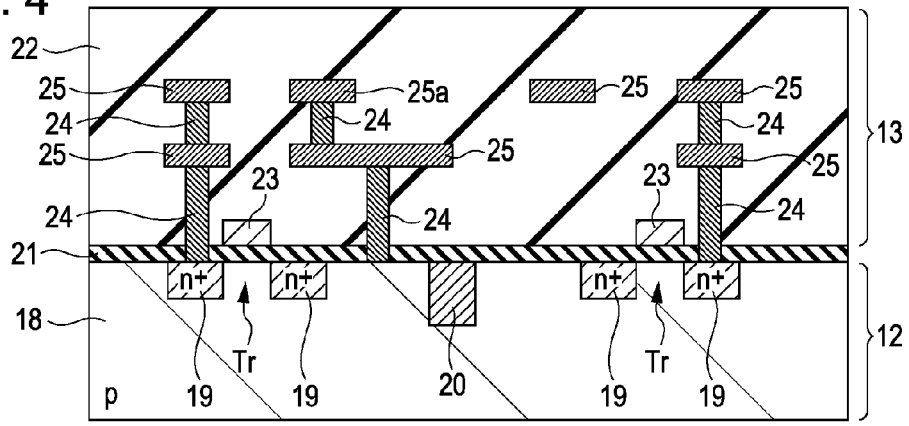
FIG. 4 shows a first step of a manufacturing method for the solid-state imaging device according to the first embodiment.

First, as shown in FIG. 4, source/drain regions 19 that form pixel transistors Tr and an element separation region 20 are formed in a first substrate 12 on the front-surface side, and a first wiring layer 13 is formed on top of the first substrate 12. These are formed by the same process as a normal manufacturing method for a solid-state imaging device. For example, the element separation region 20 is formed by the STI process, that is, by forming a trench in a predetermined region in the first substrate 12 made of a semiconductor substrate 18 on the front-surface side and then embedding an oxide film such as a silicon oxide film into the trench. Gate electrodes 23 are formed by forming a gate insulation film 21 made of a silicon oxide film over the front surface of the first substrate 12 and then patterning the polysilicon layer. The source/drain regions 19 are formed by heavily doping n-type impurities by ion implantation into the front surface of the p-type semiconductor substrate 18 using the gate electrodes 23 as masks. Thereafter, an interlayer insulation film 22 is formed from a silicon oxide film or the like above the first substrate 12, and wires 25 in a plurality of layers (in the embodiment, two layers) are formed from a metal material such as aluminum or copper, for example, via the interlayer insulation film 22. The wires 25 are formed at desired positions by patterning a metal layer made of aluminum, copper, or the like. In the first wiring layer 13, in particular, a wire 25a that is to receive a contact portion 26 is formed at a portion where the contact portion 26 is formed to extend from a second wiring layer 15 formed as an upper layer. In the formation step of the first wiring layer 13, desired contact portions 24 are formed by forming openings in the interlayer insulation film 22 between the desired wires 25 and between the wires 25 and the first substrate 12 and embedding a metal material such as tungsten, for example, into the openings. In this step, after the wires 25 are formed, the interlayer insulation film 22 is formed as an uppermost layer to cover the wires 25 in the upper layer in the first wiring layer 13.

Figure 5:
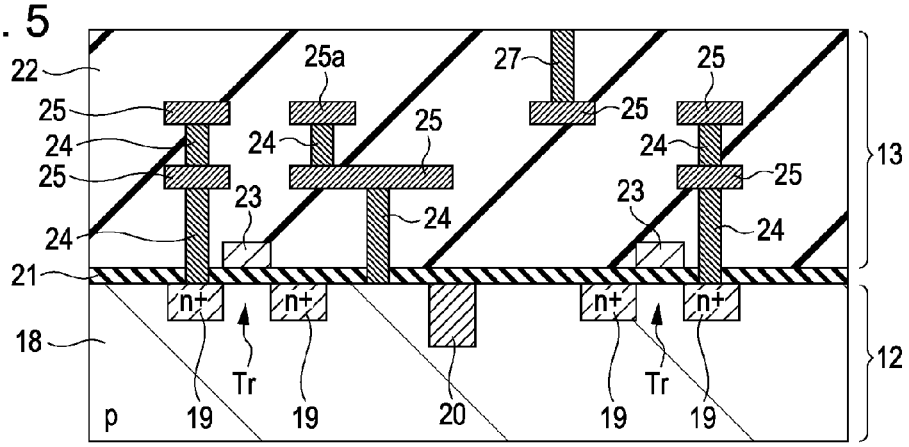
FIG. 5 shows a second step of the manufacturing method for the solid-state imaging device according to the first embodiment.

Then, as shown in FIG. 5, a contact portion 27 to be connected to the wire 25 in the first wiring layer 13 is formed at a predetermined position in the interlayer insulation film 22 as the uppermost layer of the first wiring layer 13. The contact portion 27 may be formed by forming a contact hole leading to the predetermined wire 25 from the upper surface of the interlayer insulation film 22 and embedding a metal material such as tungsten, for example, into the contact hole. That is, one end (the lower end) of the contact portion 27 is connected to the wire 25 in the first wiring layer 13, and the other end (the upper end) of the contact portion 27 is exposed to the upper surface of the first wiring layer 13.

Figure 6:
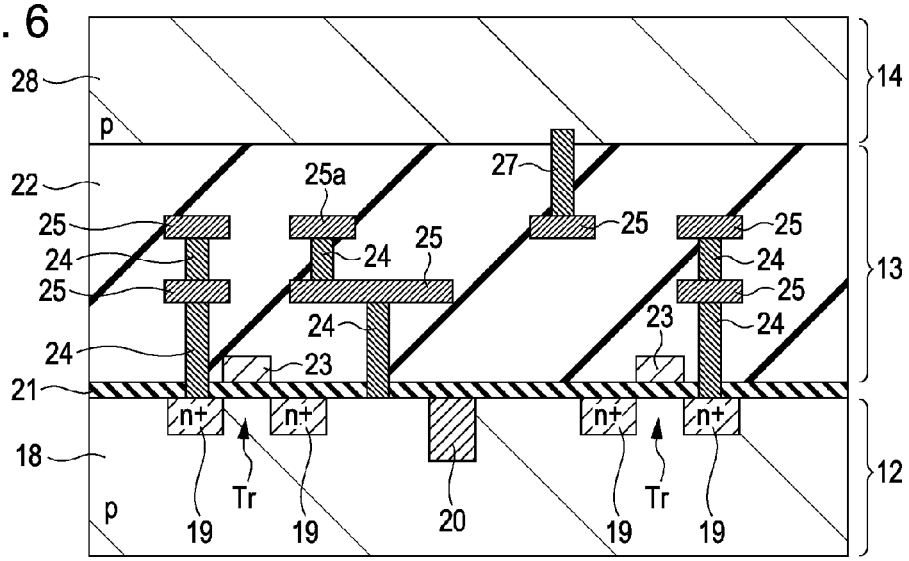
FIG. 6 shows a third step of the manufacturing method for the solid-state imaging device according to the first embodiment.

Then, as shown in FIG. 6, a second substrate 14 made of a p-type semiconductor substrate 28 is bonded to the top of the first wiring layer 13. In this event, the first wiring layer 13 and the second substrate 14 are compression-bonded to each other by adhesion between the semiconductor substrate 28 and the upper surface of the interlayer insulation film 22 forming the first wiring layer 13. A 10-μm p-type semiconductor substrate 28, for example, may be used as the second substrate 14. In the bonding step, the upper end of the contact portion 27, which is exposed to the upper surface of the first wiring layer 13, is bonded to the back surface of the second substrate 14, or preferably embedded into the back surface of the second substrate 14 as shown in FIG. 6. In order to allow such bonding, in practice, the upper end of the contact portion 27 formed in the first wiring layer 13 is formed to project above the interlayer insulation film 22, and a recess is formed in advance in the second substrate 14 at a portion where the contact portion 27 is to be embedded. This allows the second substrate 14 to be bonded onto the first wiring layer 13 with the upper end of the contact portion 27 embedded into the second substrate 14.

Figure 7:
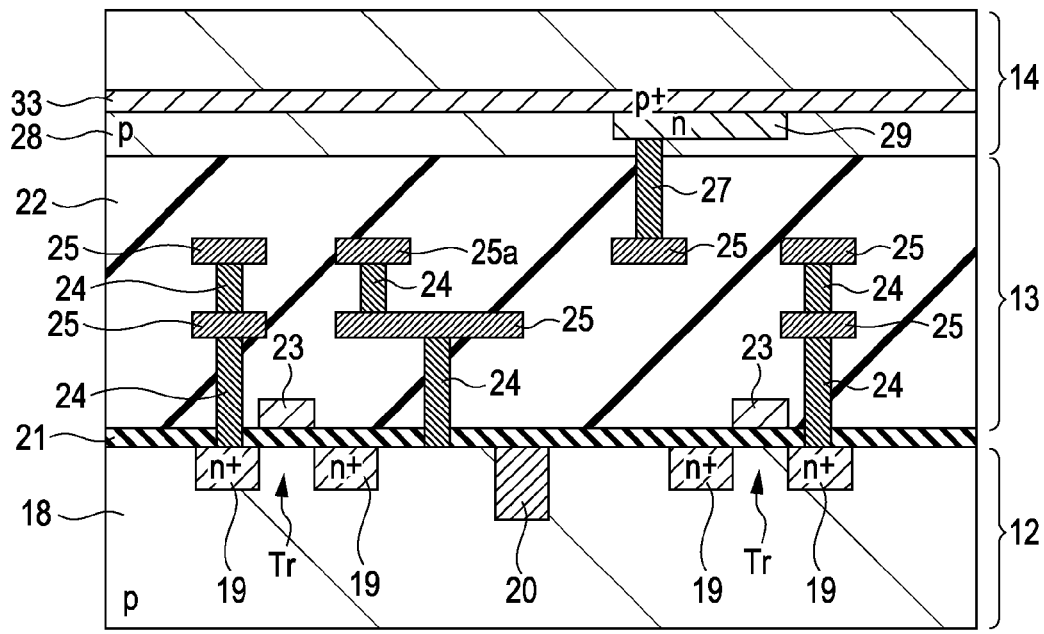
FIG. 7 shows a fourth step of the manufacturing method for the solid-state imaging device according to the first embodiment.

Then, as shown in FIG. 7, an n-type impurity is doped by ion implantation into the second substrate 14 at a region where the contact portion 27 is connected to form an overflow drain region 29. This allows the overflow drain region 29 and the wire 25 in the first wiring layer 13 to be electrically connected to each other via the contact portion 27. Thereafter, a p-type impurity is doped by ion implantation into a region above the overflow drain region 29 to form an overflow barrier 33. In the embodiment, the overflow barrier 33 is formed over the entire region of the second substrate 14 where a pixel section is formed.

Figure 8:
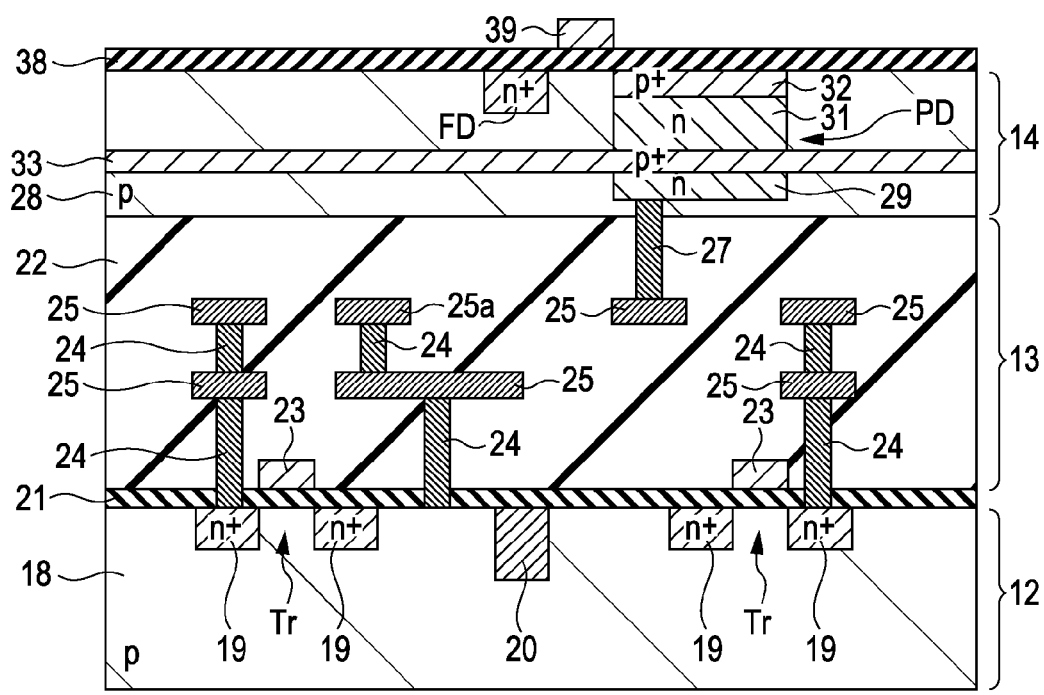
FIG. 8 shows a fifth step of the manufacturing method for the solid-state imaging device according to the first embodiment.

Then, as shown in FIG. 8, a gate insulation film 38 made of a silicon oxide film, for example, is formed on top of the second substrate 14, and then a gate electrode 39 forming a transfer transistor Tr1 is formed by forming a polysilicon layer on top of the gate insulation film 38 and patterning the polysilicon layer into a desired shape.

Thereafter, a light sensing section PD composed of an n-type impurity region 31 and a dark-current suppression region 32 and a floating diffusion node FD are formed in regions adjacent to the gate electrode 39 using the gate electrode 39 as a mask. The n-type impurity region 31 is formed by doping an n-type impurity by ion implantation on top of a region where the overflow drain region 29 and the overflow barrier 33 are formed. The dark-current suppression region 32 is formed by heavily doping a p-type impurity by ion implantation into the front-most surface of the second substrate 14 on top of the n-type impurity region 31. The floating diffusion node FD is formed by heavily doping an n-type impurity by ion implantation on the side opposite the light sensing section PD across the gate electrode 39.

Figure 9:
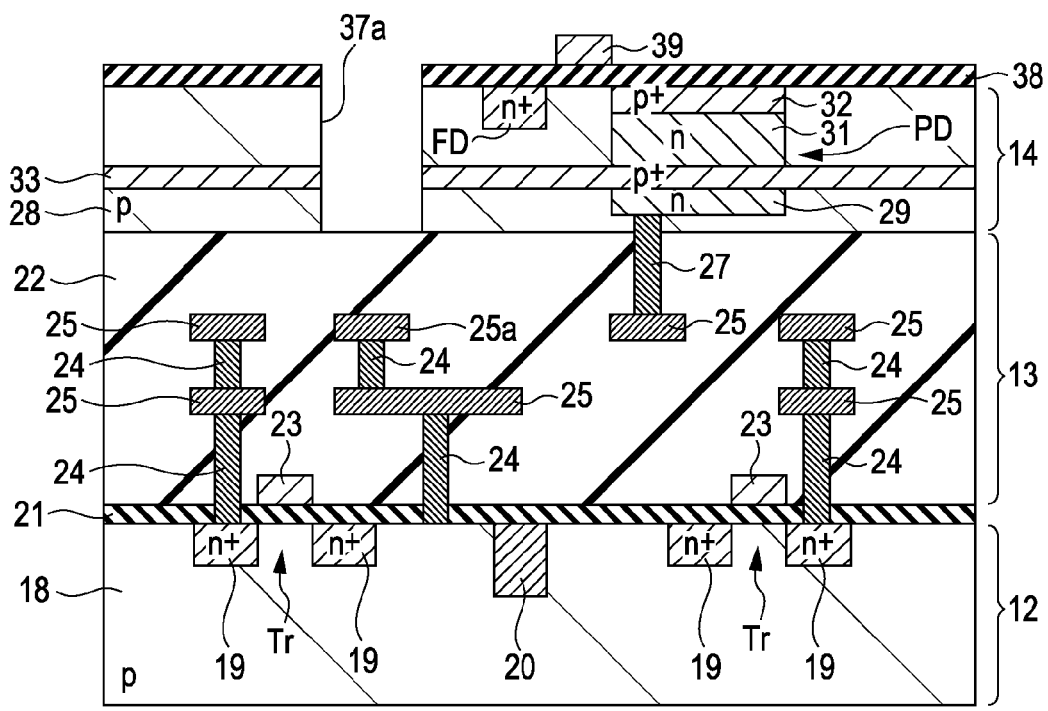
FIG. 9 shows a sixth step of the manufacturing method for the solid-state imaging device according to the first embodiment.

Then, as shown in FIG. 9, an opening 37a penetrating through the second substrate 14 is formed in the second substrate 14 at a desired position so that the upper surface of the interlayer insulation film 22 forming the first wiring layer 13 is exposed. The opening 37a is formed in a region equivalent to the wire 25a which is formed in the first wiring layer 13 to receive a contact portion 26 to be formed in a subsequent step. The opening 37a is formed to have a larger opening area than the area where the wire 25a is formed, for example.

Figure 10:
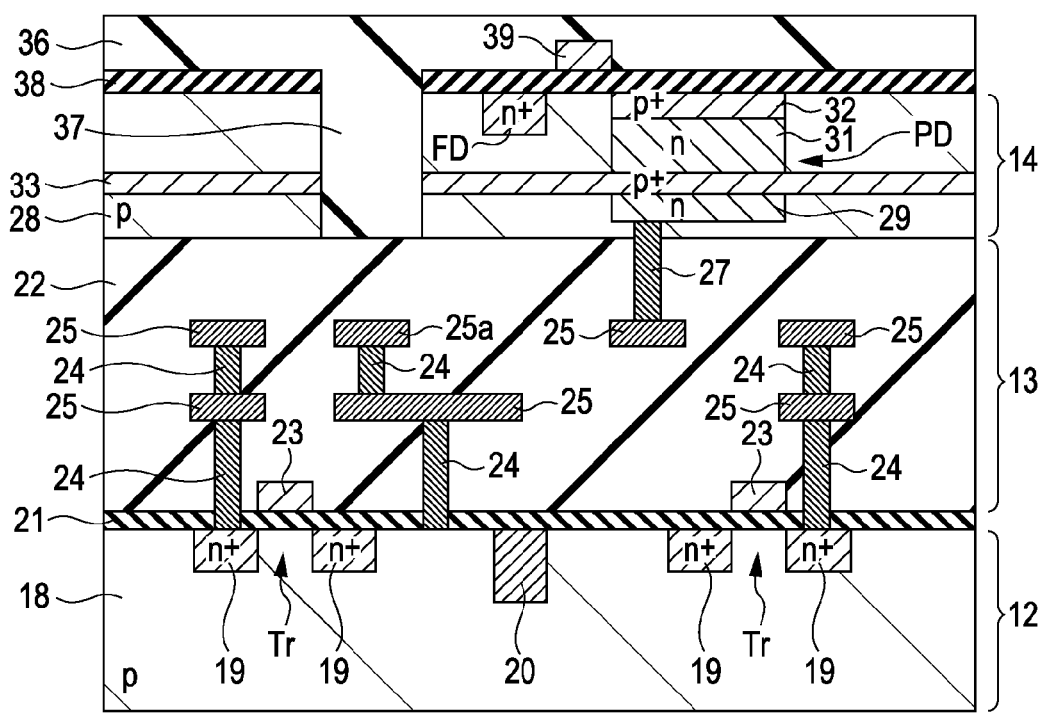
FIG. 10 shows a seventh step of the manufacturing method for the solid-state imaging device according to the first embodiment.

Then, as shown in FIG. 10, a silicon oxide film is embedded into the opening 37a formed in the second substrate 14 to form an intra-substrate insulation layer 37, and an interlayer insulation film 36 made of a silicon oxide film is formed on the upper surface of the second substrate 14 to cover the gate electrode 39.

Figure 11:
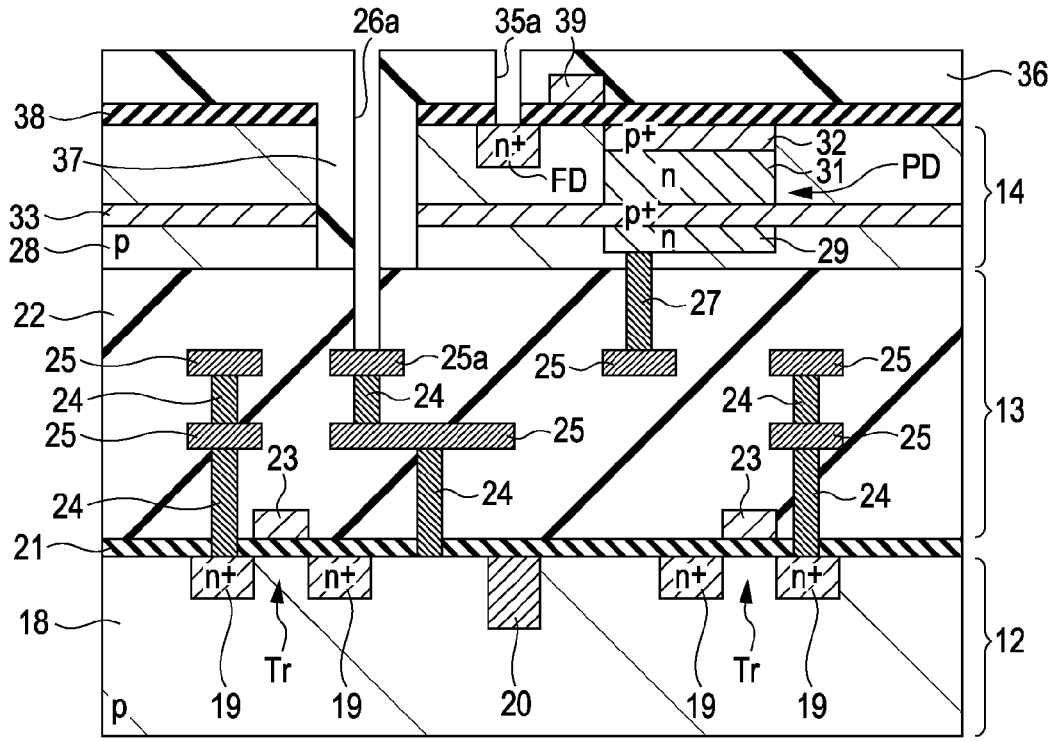
FIG. 11 shows an eighth step of the manufacturing method for the solid-state imaging device according to the first embodiment.

Then, as shown in FIG. 11, contact holes 26a and 35a are formed in the interlayer insulation film 36 at desired positions. In this step, as shown for example in FIG. 11, the contact hole 35a is formed in the interlayer insulation film 36 so as to expose the floating diffusion node FD. Also, the contact hole 26a is formed to penetrate through the interlayer insulation film 36, the intra-substrate insulation layer 37, and the interlayer insulation film 22 of the first wiring layer 13 so as to expose the wire 25a formed in the first wiring layer 13.

Figure 12:
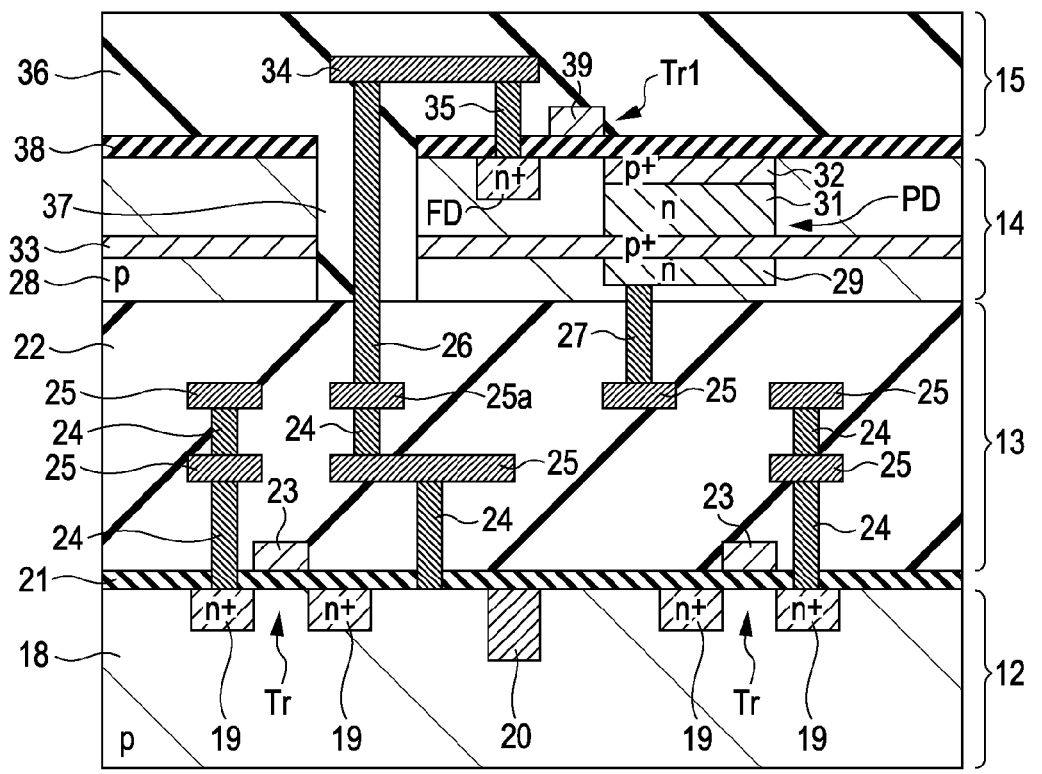
FIG. 12 shows a ninth step of the manufacturing method for the solid-state imaging device according to the first embodiment.

Then, as shown in FIG. 12, a metal material such as tungsten, for example, is embedded into the contact holes 26a and 35a to form contact portions 26 and 35. Thereafter, a wire 34 made of aluminum, copper, or the like is formed on top of the contact portions 26 and 35. The wire 34 is formed into a desired shape by patterning a metal layer made of aluminum, copper, or the like. In the embodiment, for example, the wire 34 is formed to connect the contact portion 35 and the contact portion 26 penetrating through the second substrate 14 with each other. This allows the floating diffusion node FD to be electrically connected to the wire 25 in the first wiring layer 13.

Although not shown, a wire connected to the gate electrode 39 forming the transfer transistor Tr1 may also be connected to a wire in the first wiring layer 13 via a contact portion penetrating through the second substrate 14. In this case, the transfer transistor Tr1 formed in the second substrate 14 may also be driven via the first wiring layer 13 as with the other pixel transistors Tr.

Thereafter, as shown in FIG. 12, an interlayer insulation film 36 is formed to cover the wire 34, which completes the second wiring layer 15.

Thereafter, although not shown, a color filter layer 16 and an on-chip microlens 17 are formed on top of the second wiring layer 15 by a normally employed method, which completes the solid-state imaging device 1 shown in FIG. 3.

In the formation of the solid-state imaging device 1 according to the embodiment, the second substrate 14 is bonded onto the first wiring layer 13. According to the current state of the art, bonding may be performed at a temperature of 400° C. or lower, which makes it possible to maintain the performance of the pixel transistors Tr which are formed in the first substrate 12 as a lower layer and the performance of which is necessary to be relatively high. The transistor formed in the second substrate 14 is the transfer transistor Tr1, the performance of which may be relatively low, and therefore may be formed without applying a temperature higher than 400° C. In addition, an ion implantation method used to form impurity regions, such as the light sensing section PD, in the second substrate 14 may also be performed at 400° C. or lower. Thus, it is also possible to maintain the performance of the pixel transistors Tr formed in the first substrate 12 as a lower layer.

Thus, according to the embodiment, it is possible to obtain the solid-state imaging device 1 which may be implemented in spite of a process constraint. Further, the contact portion 27 may be formed to extend from the wire 25 in the first wiring layer 13 formed on the back-surface side of the second substrate 14 to the overflow drain region 29 in the second substrate 14. Therefore, it is possible to obtain the solid-state imaging device 1 with the electronic shutter function without decreasing the light reception area.

According to the embodiment, the substrates are stacked by bonding. Therefore, the solid-state imaging device according to the embodiment is remarkably more inexpensive than solid-state imaging devices in which a thick-film epiwafer or a thin-film SOI (Silicon On Insulator) wafer is used, and is advantageous in terms of cost over back-illuminated solid-state imaging devices for which an SOI waver is necessary.

In the embodiment, the contact hole 26a which allows the contact portion 26 to penetrate through the second substrate 14 is formed by one etching operation. However, the present invention is not limited thereto. FIGS. 13A to 13D show a different example of a formation method for the contact hole 26a. FIGS. 13A to 13D specifically show a region where the contact hole 26a is to be formed.

Figure 13A:
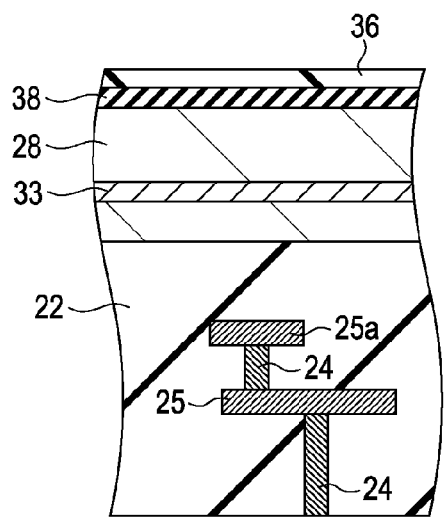
FIG. 13A shows a first step of a different example of a formation method for a contact hole.
Figure 13B:
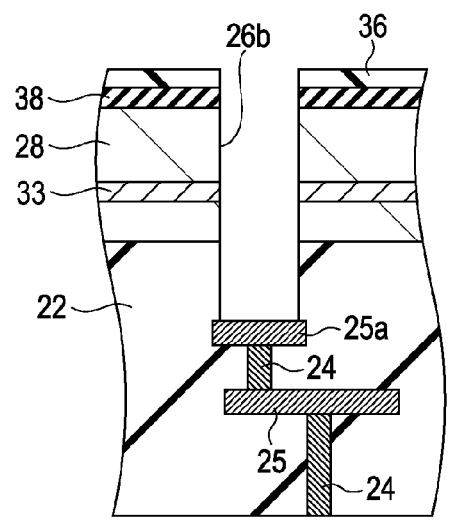
FIG. 13B shows a second step of the different example of the formation method for the contact hole.
Figure 13C:
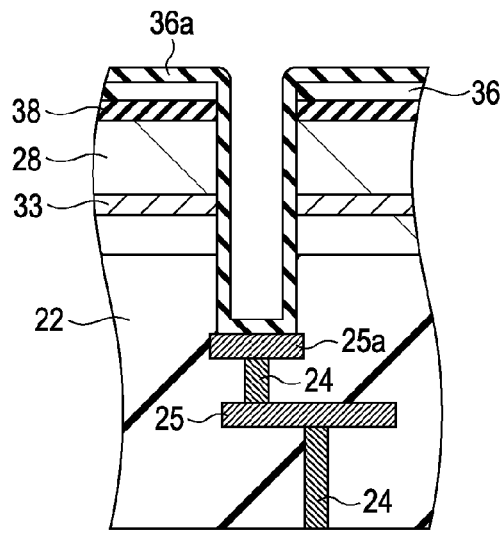
FIG. 13C shows a third step of the different example of the formation method for the contact hole.
Figure 13D:
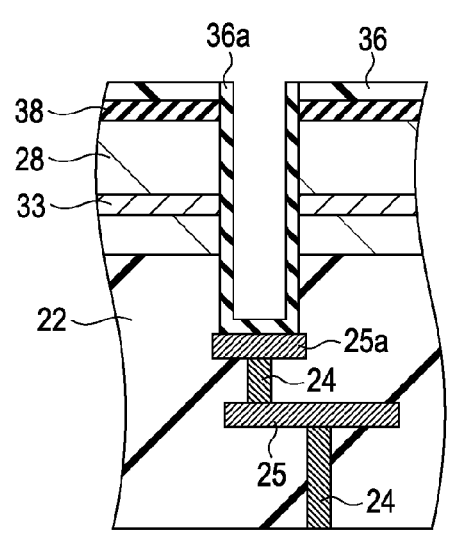
FIG. 13D shows a fourth step of the different example of the formation method for the contact hole.

First, as shown in FIG. 13A, an interlayer insulation film 36 is formed on top of the gate insulation film 38. Then, as shown in FIG. 13B, an etching process is performed on a region above the wire 25a to form an opening 26b through which the entire wire 25a in the first wiring layer 13 is exposed. At this time, the opening 26b is preferably formed to be smaller in diameter than the wire 25a which is to receive the contact portion 26. Then, as shown in FIG. 13C, an insulation film 36a is formed to cover the top of the interlayer insulation film 36 and the inner wall of the opening 26b. Then, as shown in FIG. 13D, an etching back process is performed all over the surface to expose the wire 25a. The contact hole 26a with a desired diameter is formed in this way.

By first forming a large opening 26b and then removing a once formed insulation film 36a so as to remain only on the opening 26b as shown in FIGS. 13A to 13D, a contact hole 26a with a large aspect ratio may be formed precisely. In the case where the contact hole 26a is formed by this formation method, the film thickness of the insulation film 36a may be determined so as to provide insulation between the substrate 28 and a contact material forming the contact portion 26 and such that the remaining insulation film 36a will not cause a dielectric breakdown. Meanwhile, it is necessary that the film thickness of the insulation film 37 in FIG. 12 should be determined in consideration of displacement in overlapping position between the opening 37a shown in FIG. 9 and the opening 26a in FIG. 11, and thus it is necessary that the opening 37a should be larger in opening diameter than the counterpart in the formation method shown in FIGS. 13A to 13D. Therefore, the formation method shown in FIGS. 13A to 13D is advantageous in terms of the opening formation area.

In the solid-state imaging device 1 according to the embodiment, the p-type semiconductor substrate 28 is used to form the second substrate 14. However, an n-type semiconductor substrate on which a p-type well layer is formed may also be used. In this case, a light sensing section PD may be formed in the p-type well layer, an overflow barrier 33 may be formed by a p-type impurity region on the bottom of the light sensing section PD, and an overflow drain region 29 may be formed by an n-type impurity region at the interface between the well layer and the n-type semiconductor substrate. On the contrary, a p-type semiconductor substrate on which an n-type epitaxial growth layer is formed may also be used. Various other modifications are also possible. In such cases, a pnpn junction is formed in the second substrate 14, in which the light sensing section PD is formed, from the front-surface side to the back-surface side. Also, the concentration of impurities in each impurity region is set such that each region may demonstrate its function.

In the solid-state imaging device 1 according to the embodiment, the light sensing section PD and the transfer transistor Tr1 are formed in the substrate as an upper layer (the second substrate 14) on the light incident side, and the pixel transistors Tr other than the transfer transistor Tr1 are formed in the substrate as a lower layer (the first substrate 12). However, the present invention is not limited to such a configuration. Other drive circuits may be formed in the substrate as a lower layer, and analogue circuits, besides digital circuits, may also be formed.

<2. Second Embodiment>

[2-1 Cross-Sectional Configuration of Main Portion]

Figure 14:
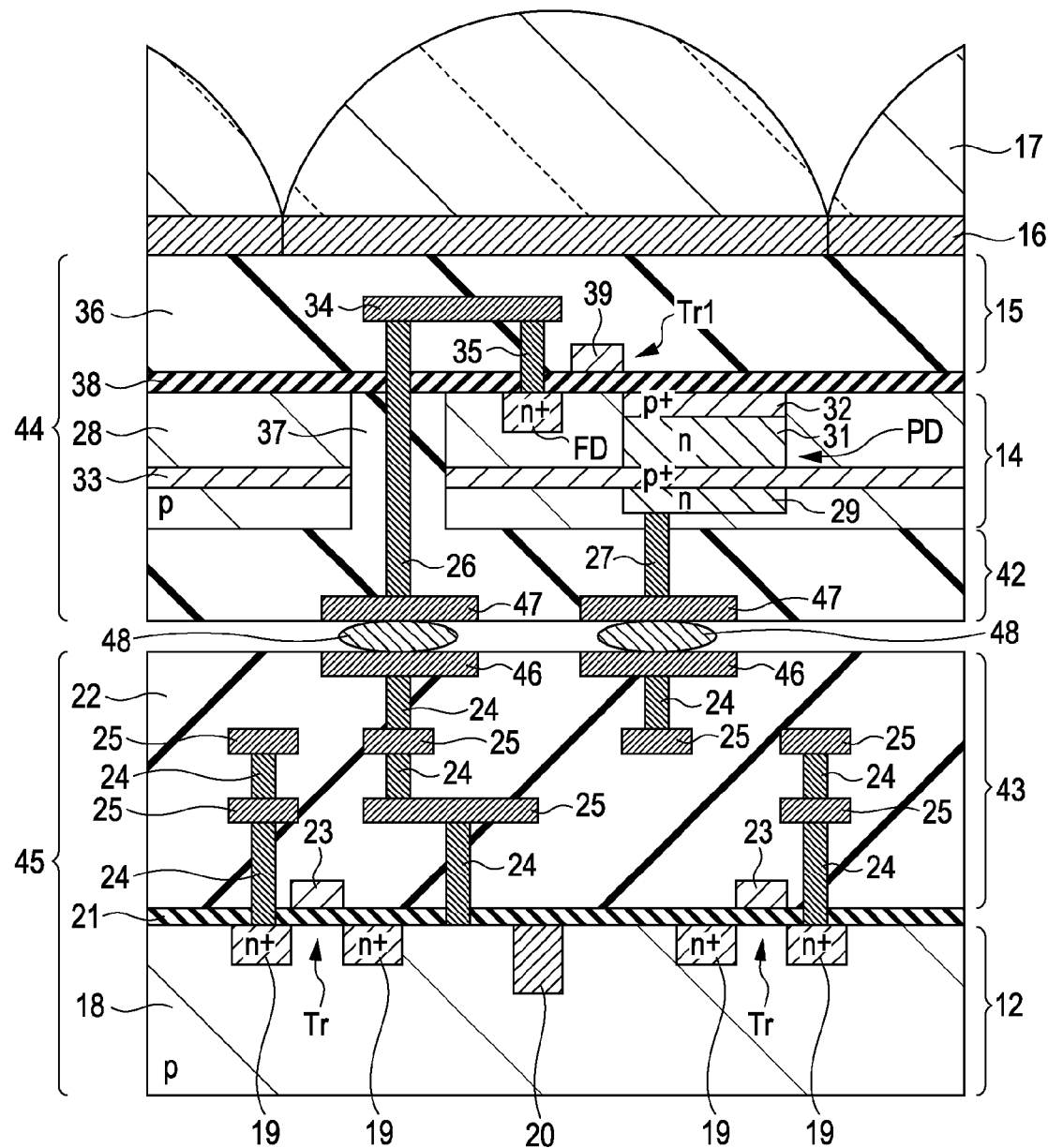
FIG. 14 is a cross-sectional view showing a schematic configuration of a pixel section of a solid-state imaging device according to a second embodiment.

FIG. 14 is a cross-sectional view showing a schematic configuration of a pixel section of a solid-state imaging device 40 according to a second embodiment. The overall configuration of the solid-state imaging device 40 and the circuit configuration of each pixel according to the embodiment are the same as the configurations shown in FIGS. 1 and 2, and thus redundant description will be omitted. Also, components in FIG. 14 corresponding to the components in FIG. 3 are denoted by the same reference symbols to omit redundant description. In the solid-state imaging device 40 according to the embodiment, micropads are formed in a wiring layer and an insulation layer on substrates, and the micropads are connected through microbumps to stack the two substrates.

As shown in FIG. 14, the solid-state imaging device 40 according to the embodiment has a three-dimensional structure in which the first substrate 12, a first wiring layer 43, an insulation layer 42, the second substrate 14, the second wiring layer 15, the color filter layer 16, and the on-chip microlens 17 are stacked in this order toward the light incident side.

In the embodiment, micropads 46 for microbumps are formed to be exposed on top of the interlayer insulation film 22 provided in the first wiring layer 43 on the side facing the insulation layer 42. The micropads 46 are connected to the desired wires 25 formed in the first wiring layer 43 via the contact portions 24 formed in the interlayer insulation film 22.

In the embodiment, the first substrate 12 and the first wiring layer 43 are collectively referred to as a "first element 45".

The insulation layer 42 is formed on the non-light incident side of the second substrate 14. Micropads 47 for microbumps are formed to be exposed on a surface (back surface) of the insulation layer 42 on the first wiring layer 43 side. The contact portion 27 connected to the overflow drain region 29 formed in the second substrate 14 is formed in the insulation layer 42. The contact portion 27 is connected to the micropad 47. Also, the contact portion 26 connected to the wire 34 in the second wiring layer 15 and penetrating through the intra-substrate insulation layer 37 penetrates through the insulation layer 42 to be connected to the micropad 47 formed on the back surface of the insulation layer 42.

In the embodiment, the insulation layer 42, the second substrate 14, and the second wiring layer 15 are collectively referred to as a "second element 44".

In the solid-state imaging device 40 according to the embodiment, the micropads 46 formed on top of the first wiring layer 43 and the micropads 47 formed on the back surface of the insulation layer 42 are electrically connected through microbumps 48. This allows the first element 45 and the second element 44 to be connected to each other, and thus allows the contact portions 26 and 27, which are respectively connected to the wire 34 in the second wiring layer 15 and the overflow drain region 29, to be respectively electrically connected to the wires 25 in the first wiring layer 43.

The solid-state imaging device 40 structured as described above may operate in the same way as the solid-state imaging device 1 according to the first embodiment to implement the electronic shutter function.

[2-2. Manufacturing Method]

FIGS. 15 to 25 show respective steps of a manufacturing method for the solid-state imaging device 40 according to the embodiment. The manufacturing method for the solid-state imaging device 40 according to the embodiment will be described with reference to FIGS. 15 to 25.

First, a manufacturing method for the first element 45 will be described.

Figure 15:
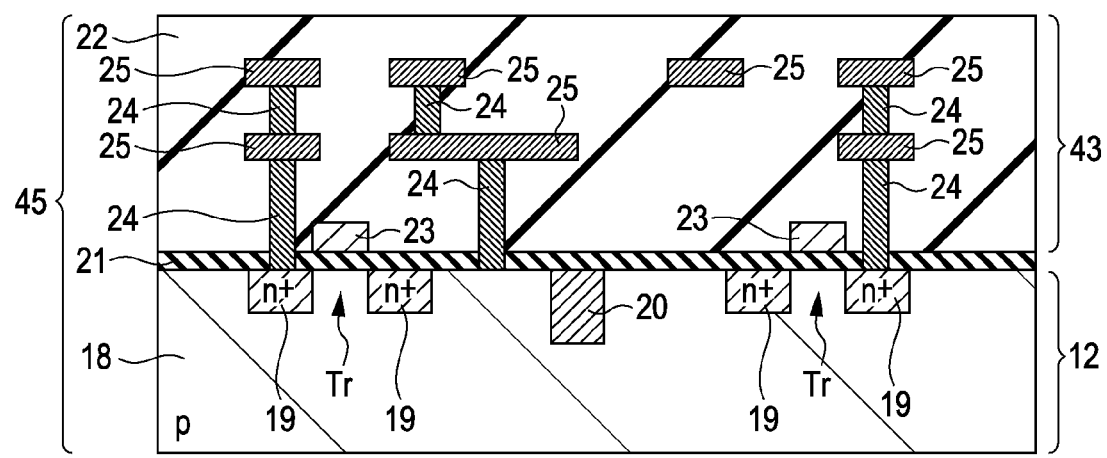
FIG. 15 shows a first step of a manufacturing method for the solid-state imaging device according to the second embodiment.

As shown in FIG. 15, a first substrate 12 and a first wiring layer 43 are formed using the same step as the step illustrated in FIG. 4 in relation to the first embodiment.

Figure 16:
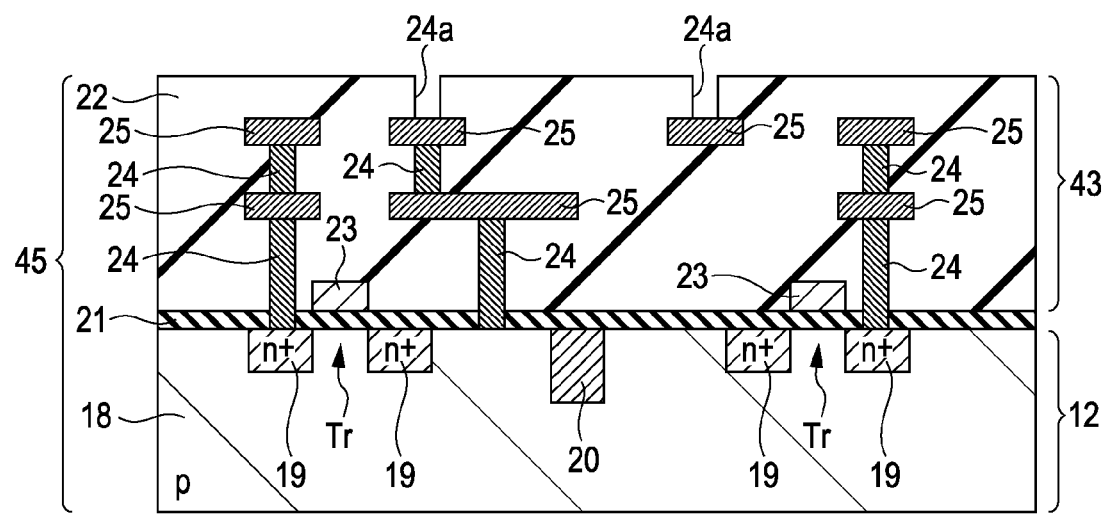
FIG. 16 shows a second step of the manufacturing method for the solid-state imaging device according to the second embodiment.

Then, as shown in FIG. 16, the interlayer insulation film 22 as an upper layer is removed by etching at desired positions to form contact holes 24a so as to expose desired wires 25.

Figure 17:
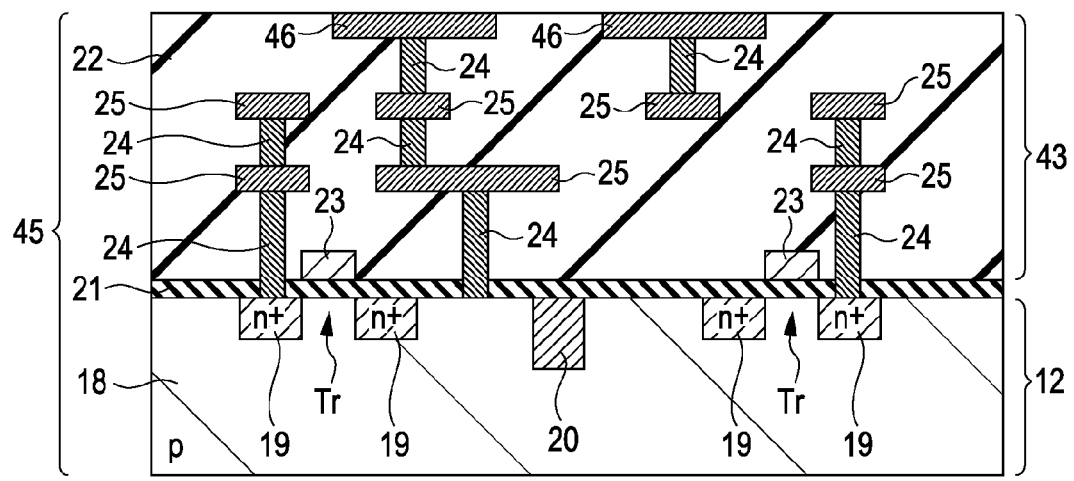
FIG. 17 shows a third step of the manufacturing method for the solid-state imaging device according to the second embodiment.

Then, as shown in FIG. 17, a metal material such as tungsten, for example, is embedded into the contact holes 24a to form contact portions 24. After the contact portions 24 are formed, micropads 46 are formed in regions covering the contact portions 24 by patterning a metal layer made of aluminum, copper, or the like into a desired shape. While the micropads 46 and the interlayer insulation film 22 as the uppermost layer are formed to be flush with each other in FIG. 17, they may be not flush with each other. For example, the interlayer insulation film 22 may be formed to be raised with respect to the micropads 46, in which case displacement of the microbumps 48 or the like may be suppressed in a subsequent step to establish a precise connection. Also, a diffusion prevention layer that prevents tin in the microbumps 48 from diffusing over the micropads 46 and a close contact layer that secures close contact between the diffusion prevention layer and the micropads 46 are formed on the micropads 46, although not shown. As the diffusion prevention layer, a metal film made of copper, nickel (Ni), iron (Fe), gold (Au), palladium (Pd), or the like, or an alloy film made of an alloy of such metals may be used. As the close contact layer, a metal film made of titanium (Ti), chromium (Cr), tungsten (W), titanium tungsten (TiW), cobalt (Co), beryllium (Be), or the like, or an alloy film made of an alloy of such metals may be used.

Next, a manufacturing method for the second element 44 will be described.

Figure 18:
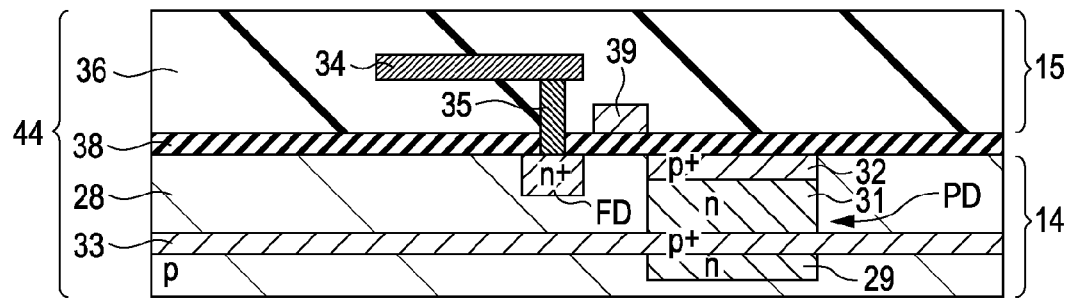
FIG. 18 shows a fourth step of the manufacturing method for the solid-state imaging device according to the second embodiment.

As shown in FIG. 18, a second substrate 14 including impurity regions forming a light sensing section PD made of a photodiode and an overflow structure is formed using a normal manufacturing method for a front-illuminated solid-state imaging device. Then, a second wiring layer 15 including a gate insulation film 38, a gate electrode 39, a wire 34, and a contact portion 35 is formed on the second substrate 14.

An overflow drain region 29 in the second substrate 14 is formed by doping an n-type impurity by ion implantation. An overflow barrier 33 is formed by doping a p-type impurity by ion implantation. The light sensing section PD and a floating diffusion node FD are formed after the gate insulation film 38 and the gate electrode 39 are formed in the same way as in the first embodiment. That is, the light sensing section PD and the floating diffusion node FD may be formed using the gate electrode 39 as a mask.

Figure 19:
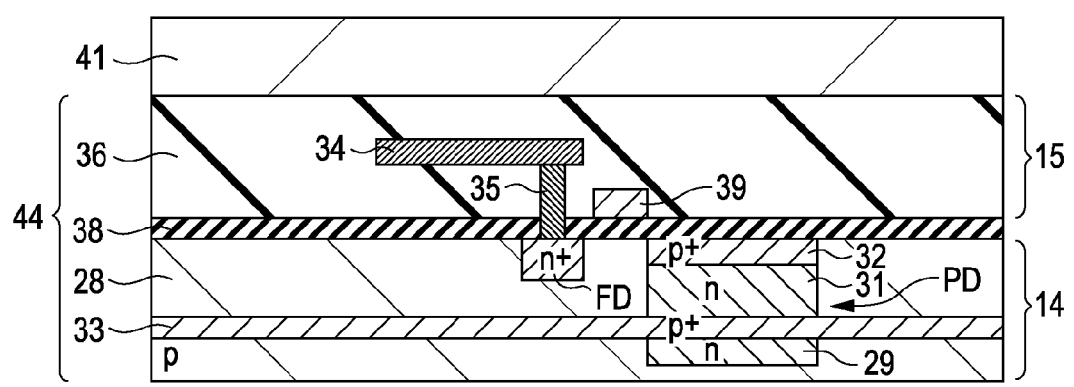
FIG. 19 shows a fifth step of the manufacturing method for the solid-state imaging device according to the second embodiment.

Then, as shown in FIG. 19, a support substrate 41 is joined to the top of the second wiring layer 15.

Figure 20:
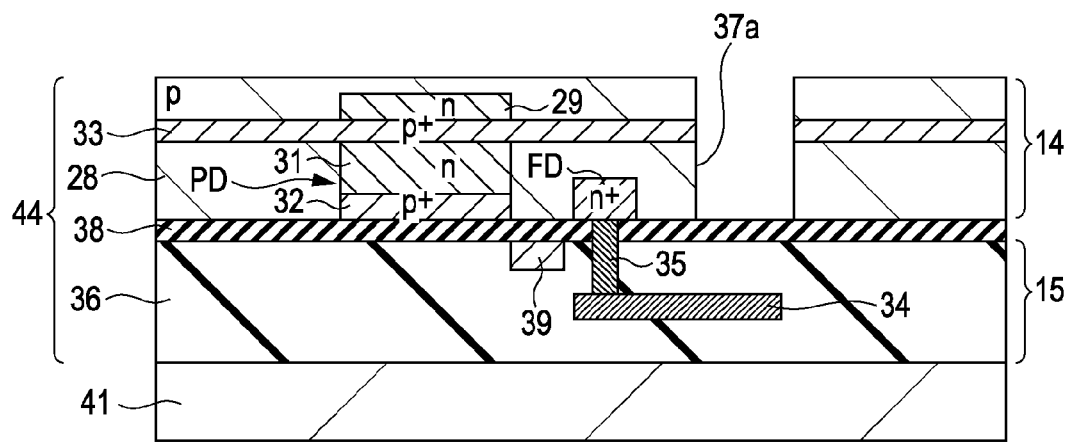
FIG. 20 shows a sixth step of the manufacturing method for the solid-state imaging device according to the second embodiment.

Then, as shown in FIG. 20, the second element 44 to which the support substrate 41 is joined is inverted, and an opening 37a penetrating through a semiconductor substrate 28 is formed by etching to extend from the back-surface side of the second substrate 14, which is opposite the side to which the support substrate 41 is connected, to the front-surface side. The opening 37a is formed in the second substrate 14 at a desired position. In the embodiment, the opening 37a is formed in a region equivalent to the wire 34 formed in the second wiring layer 15.

Figure 21:
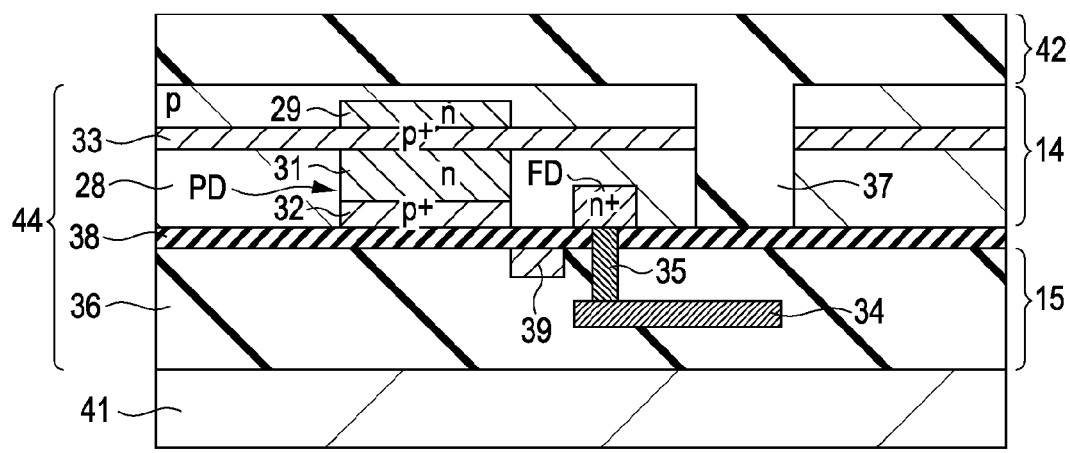
FIG. 21 shows a seventh step of the manufacturing method for the solid-state imaging device according to the second embodiment.

Then, as shown in FIG. 21, a silicon oxide film, for example, is embedded into the opening 37a to form an intra-substrate insulation layer 37, and a silicon oxide film, for example, is formed over the entire back surface of the second substrate 14 to form an insulation layer 42.

Figure 22:
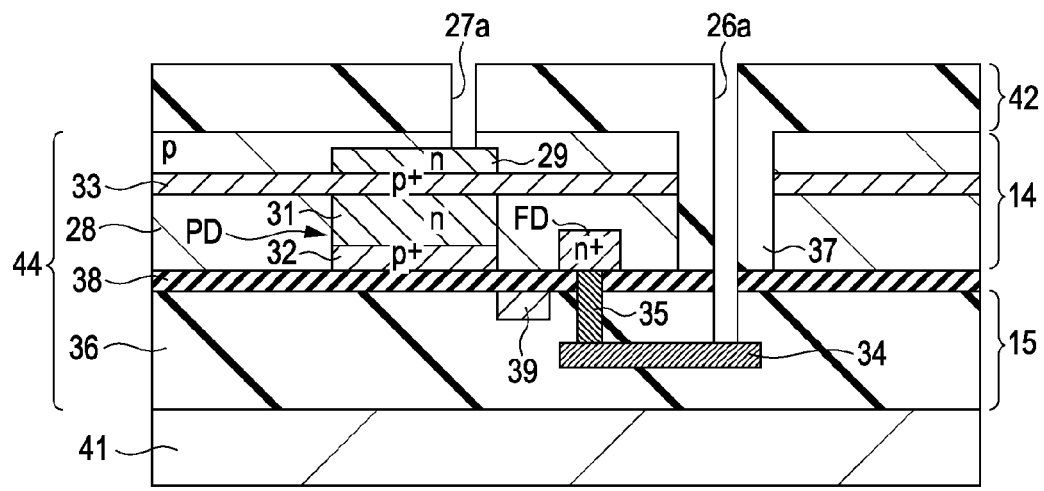
FIG. 22 shows an eighth step of the manufacturing method for the solid-state imaging device according to the second embodiment.

Then, as shown in FIG. 22, the insulation layer 42 and the back-surface side of the second substrate 14 are etched to form a contact hole 27a so as to expose the overflow drain region 29 in the second substrate 14. Also, the insulation layer 42, the intra-substrate insulation layer 37, the gate insulation film 38, and the interlayer insulation film 36 are etched to form a contact hole 26a so as to expose the wire 34 in the second wiring layer 15.

Figure 23:
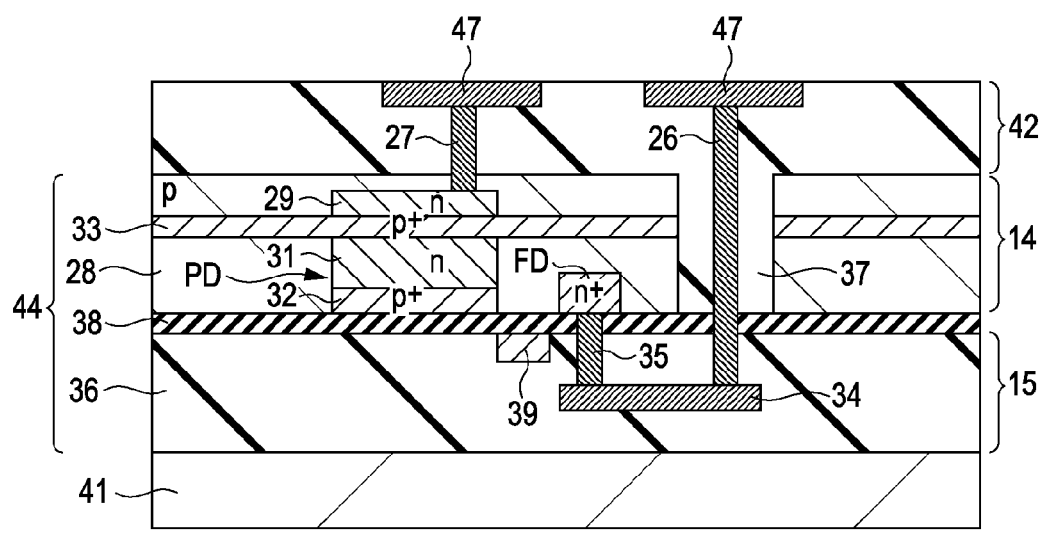
FIG. 23 shows a ninth step of the manufacturing method for the solid-state imaging device according to the second embodiment.

Then, as shown in FIG. 23, a metal material such as tungsten, for example, is embedded into the contact holes 26a and 27a to form contact portions 26 and 27. After the contact portions 26 and 27 are formed, micropads 47 are formed in regions covering the contact portions 26 and 27 by patterning a metal layer made of aluminum, copper, or the like into a desired shape. While the micropads 47 formed in the second element 44 and the insulation layer 42 are formed to be flush with each other in FIG. 23, they may be not flush with each other, as with the micropads 46 formed in the first element 45. For example, the surface of the insulation layer 42 may be formed to be raised with respect to the micropads 47, in which case a precise connection may be established using the microbumps 48 in a subsequent step.

After the first element 45 and the second element 44 are completed as described above, as shown in FIG. 24, the micropads 46 in the first element 45 and the micropads 47 in the second element 44 are connected through microbumps 48. This allows the first element 45 and the second element 44 to be bonded to each other.

Figure 24:
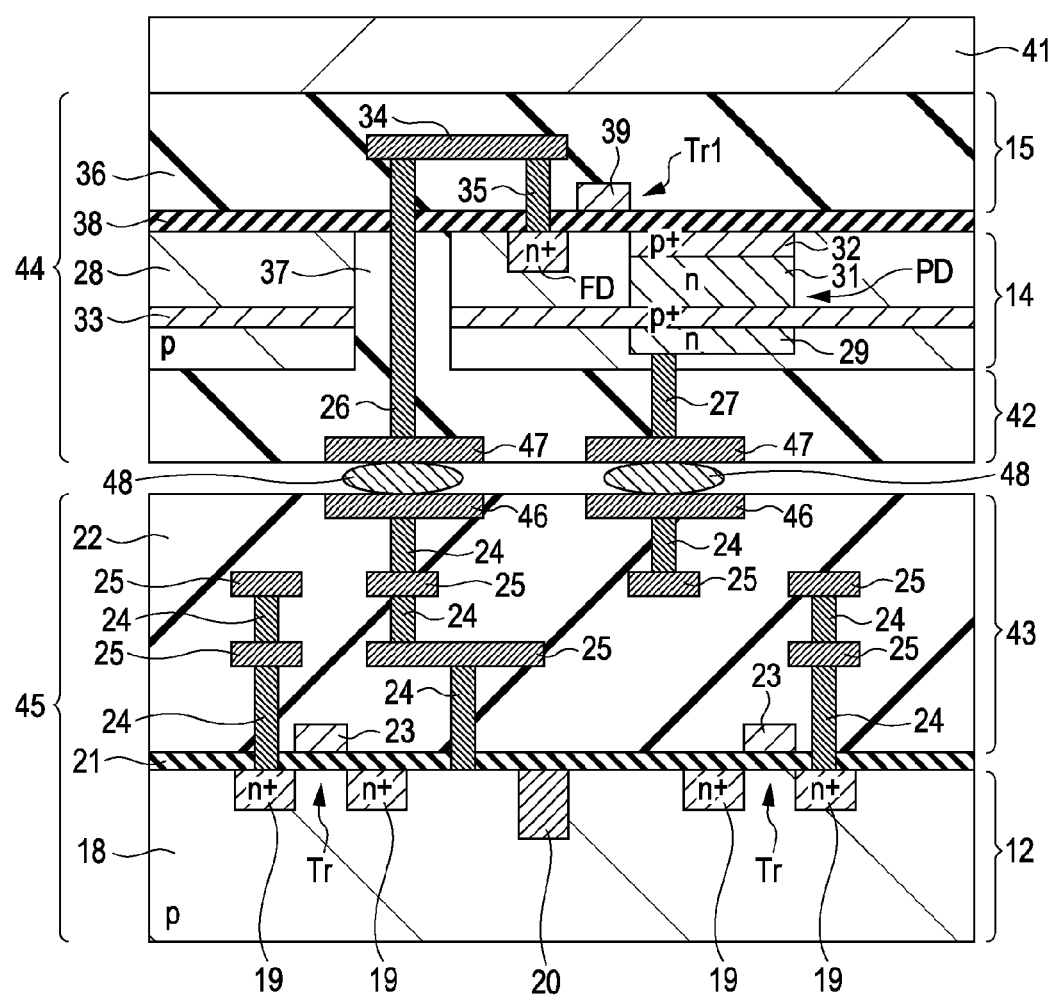
FIG. 24 shows a tenth step of the manufacturing method for the solid-state imaging device according to the second embodiment.
Figure 25:
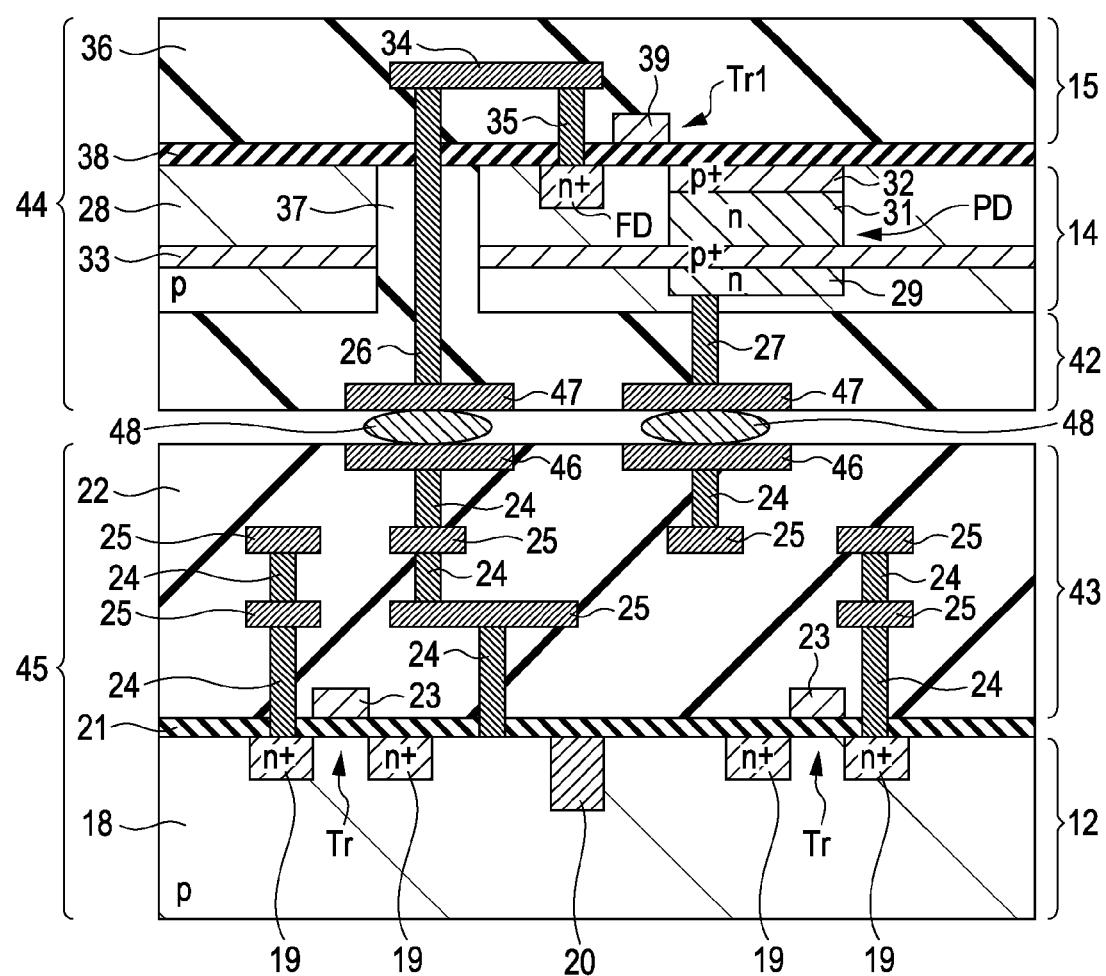
FIG. 25 shows an eleventh step of the manufacturing method for the solid-state imaging device according to the second embodiment.

Then, as shown in FIG. 25, the support substrate 41, which has been attached to the surface of the second element 44 until the step of FIG. 24, is removed using a grinding process, a CMP (Chemical Mechanical Polishing) process, or the like.

Thereafter, although not shown, a color filter layer 16 and an on-chip microlens 17 are formed on top of the second wiring layer 15 by a normally employed method, which completes the solid-state imaging device 40 shown in FIG. 14.

In the manufacturing method for the solid-state imaging device 40 according to the embodiment, the first element 45 and the second element 44 are formed separately to be finally bonded to each other. Therefore, the impurity regions formed in the substrates in the elements may be formed before the wires are formed. Therefore, the solid-state imaging device 40 according to the embodiment may be formed without performing a high-temperature process after the wires are formed.

Also, in the manufacturing method for the solid-state imaging device 40 according to the embodiment, the contact portion 27 to be connected to the overflow drain region 29 is formed by forming the contact hole 27a in the second substrate 14 at a desired position from the insulation layer 42 side. Thus, it is possible to form the contact portion 27 from the back-surface side of the second substrate 14. Thus, in the case where the upper end of the contact portion 27 is to be embedded into the back-surface side of the second substrate 14, such an embedded configuration may be achieved easily compared to the first embodiment.

<3. Third Embodiment>

[3-1 Cross-Sectional Configuration of Main Portion]

Figure 26:
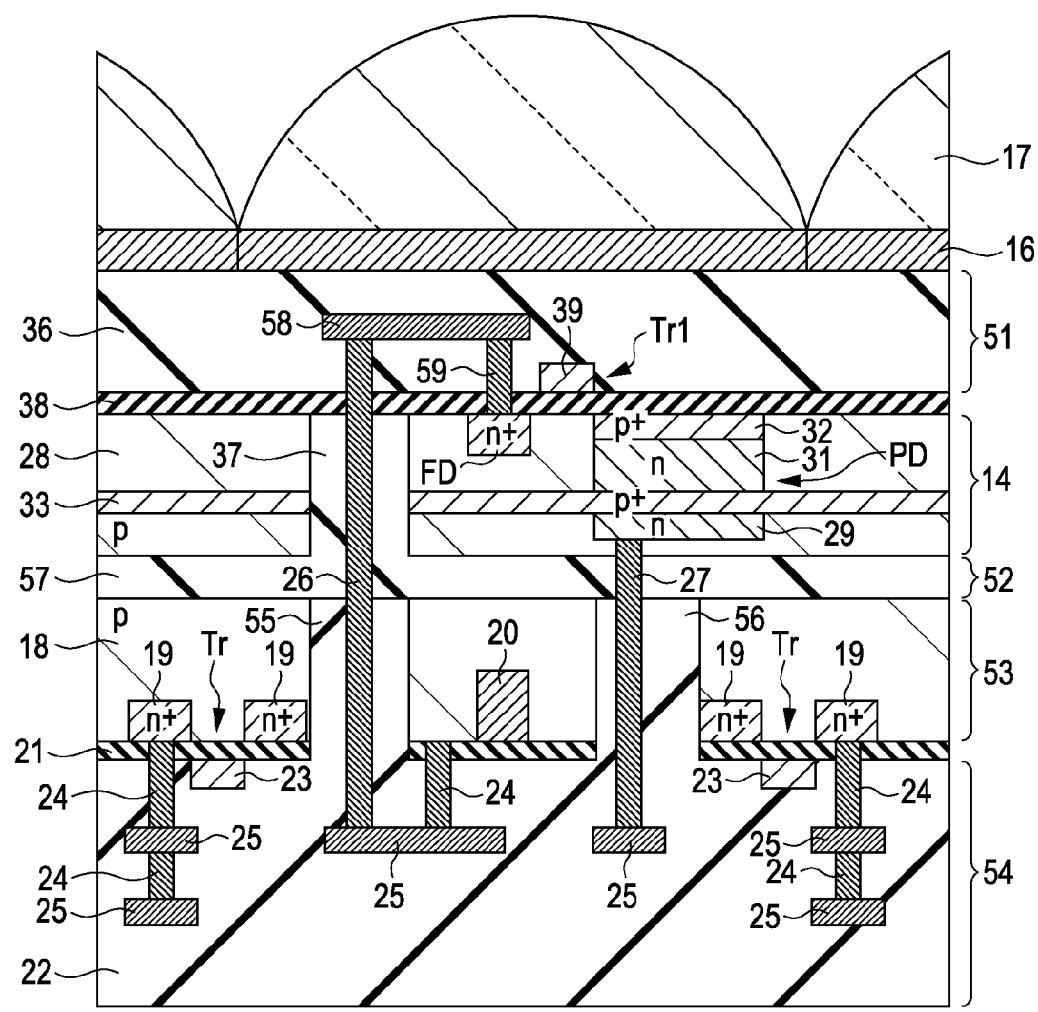
FIG. 26 is a cross-sectional view showing a schematic configuration of a pixel section of a solid-state imaging device according to a third embodiment.

FIG. 26 is a cross-sectional view showing a schematic configuration of a pixel section of a solid-state imaging device 50 according to a third embodiment. The overall configuration of the solid-state imaging device 50 and the circuit configuration of each pixel according to the embodiment are the same as the configurations shown in FIGS. 1 and 2, and thus redundant description will be omitted. Also, components in FIG. 26 corresponding to the components in FIG. 3 are denoted by the same reference symbols to omit redundant description.

As shown in FIG. 26, the solid-state imaging device 50 according to the embodiment has a three-dimensional structure in which a first wiring layer 54, a first substrate 53, an insulation layer 52, the second substrate 14, a second wiring layer 51, the color filter layer 16, and the on-chip microlens 17 are stacked in this order toward the light incident side.

The first wiring layer 54 includes a plurality of layers (in the embodiment, two layers) of wires 25 formed via the interlayer insulation film 22. The wires 25 are connected to each other via contact portions 24. Also, contact portions 24 are provided to connect the desired wires 25 in the first wiring layer 54 and desired regions in the first substrate 53 formed on top of the first wiring layer 54.

The element separation region 20 and the source/drain regions 19 of the pixel transistors Tr are formed in the first substrate 53 on the side of the back surface (a surface contacting the first wiring layer 54). The gate electrodes 23 are formed in the first wiring layer 54 on the back surface of the first substrate 53 via the gate insulation film 21. Intra-substrate insulation layers 55 and 56 penetrating through the first substrate 53 are formed in desired regions of the first substrate 53.

In the solid-state imaging device 50 according to the embodiment, the first wiring layer 54 and the first substrate 53 are inverted compared to the first substrate 12 and the first wiring layer 13 in the solid-state imaging device 1 according to the first embodiment. In the second wiring layer 51, a contact portion 59 connected to the floating diffusion node FD and a wire 58 are formed from a high-melting point metal material such as tungsten, for example. As the high-melting point metal material, titanium (Ti), molybdenum (Mo), and tantalum (Ta) may alternatively be used.

The wire 25 in the first wiring layer 54 is connected to the overflow drain region 29 in the second substrate 14 through the contact portion 27 penetrating through the intra-substrate insulation layer 56. Also, the wire 58 in the second wiring layer 51 and the desired wire 25 in the first wiring layer 54 are connected to each other via the contact portion 26 penetrating through the intra-substrate insulation layers 55 and 37.

The other components are the same as those of the solid-state imaging device 1 described in relation to the first embodiment, and thus will not be described.

The solid-state imaging device 50 according to the embodiment may operate in the same way as the solid-state imaging device 1 according to the first embodiment to implement the electronic shutter function.

[3-2. Manufacturing Method]

FIGS. 27 to 35 show respective steps of a manufacturing method for the solid-state imaging device 50 according to the embodiment. The manufacturing method for the solid-state imaging device 50 according to the embodiment will be described with reference to FIGS. 27 to 35.

Figure 27:
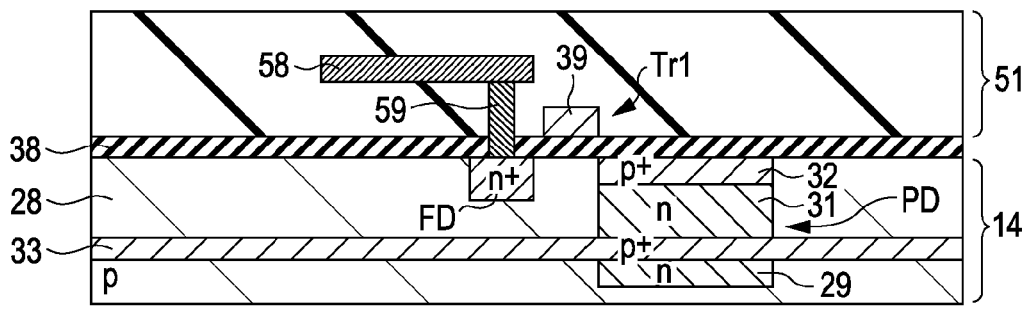
FIG. 27 shows a first step of a manufacturing method for the solid-state imaging device according to the third embodiment.

First, as shown in FIG. 27, a second substrate 14 and a second wiring layer 51 provided on the second substrate 14 are formed using the same step as the step illustrated in FIG. 18 in relation to the second embodiment. It should be noted that the contact portion 59 and the wire 58 are formed from tungsten, which is a high-melting point metal material, in the second wiring layer 51 according to the embodiment, in contrast to the second wiring layer 15 according to the second embodiment.

Figure 28:
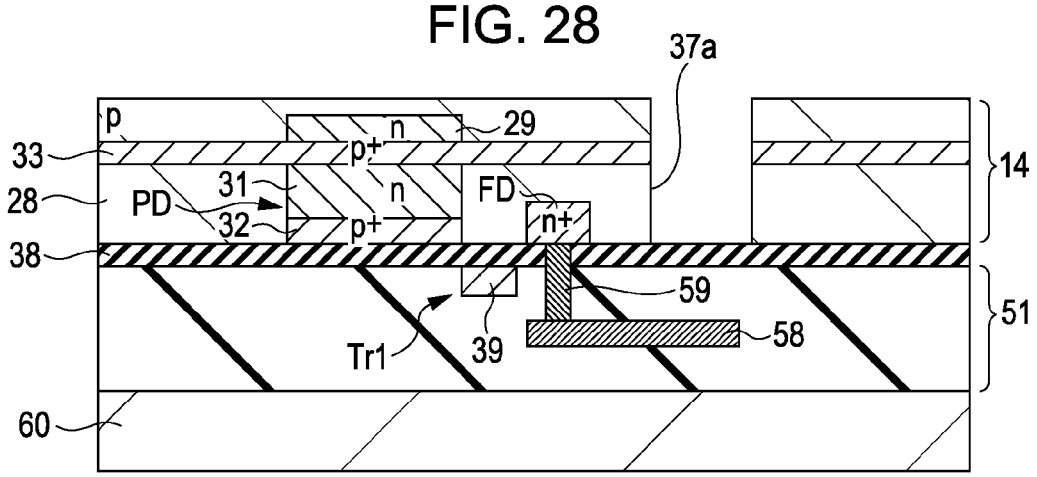
FIG. 28 shows a second step of the manufacturing method for the solid-state imaging device according to the third embodiment.

Then, as shown in FIG. 28, a support substrate 60 is bonded to the top of the second wiring layer 51, and after the assembly is inverted, etching is performed from the back-surface side of the second substrate 14 to the front-surface side of the second substrate 14 to form an opening 37a penetrating through the second substrate 14. The opening 37a is formed in the second substrate 14 at a desired position. In the embodiment, the opening 37a is formed above (in FIG. 26, below) a region where the wire 58 in the second wiring layer 51 is formed.

Figure 29:
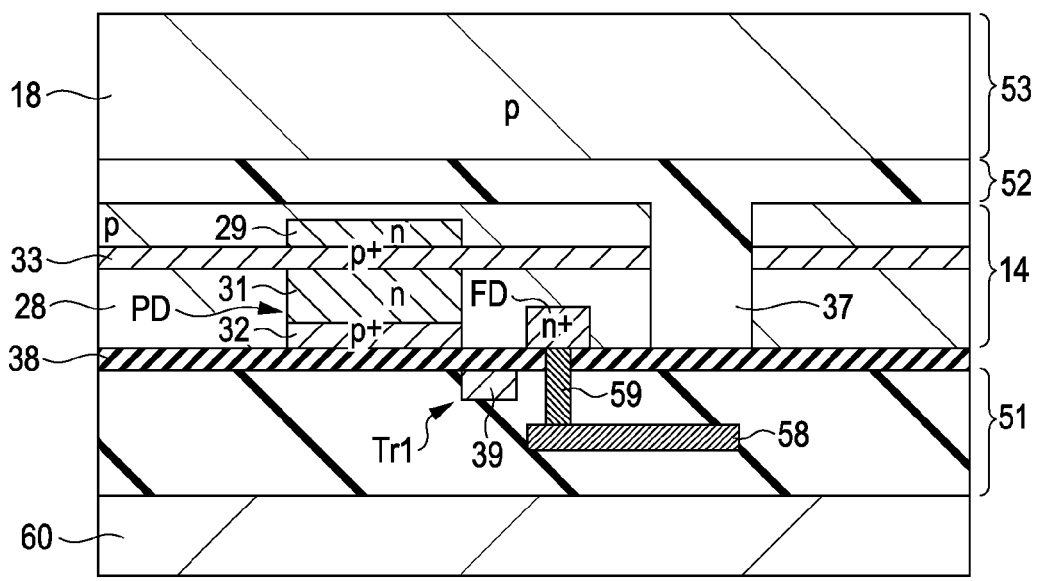
FIG. 29 shows a third step of the manufacturing method for the solid-state imaging device according to the third embodiment.

Then, as shown in FIG. 29, an insulation film such as a silicon oxide film, for example, is embedded into the opening 37a to form an intra-substrate insulation layer 37, and an insulation film such as a silicon oxide film is formed to cover the back surface of the second substrate 14 to form an insulation layer 52. Thereafter, a p-type semiconductor substrate 18 forming a first substrate 53 is formed on the insulation layer 52.

Figure 30:
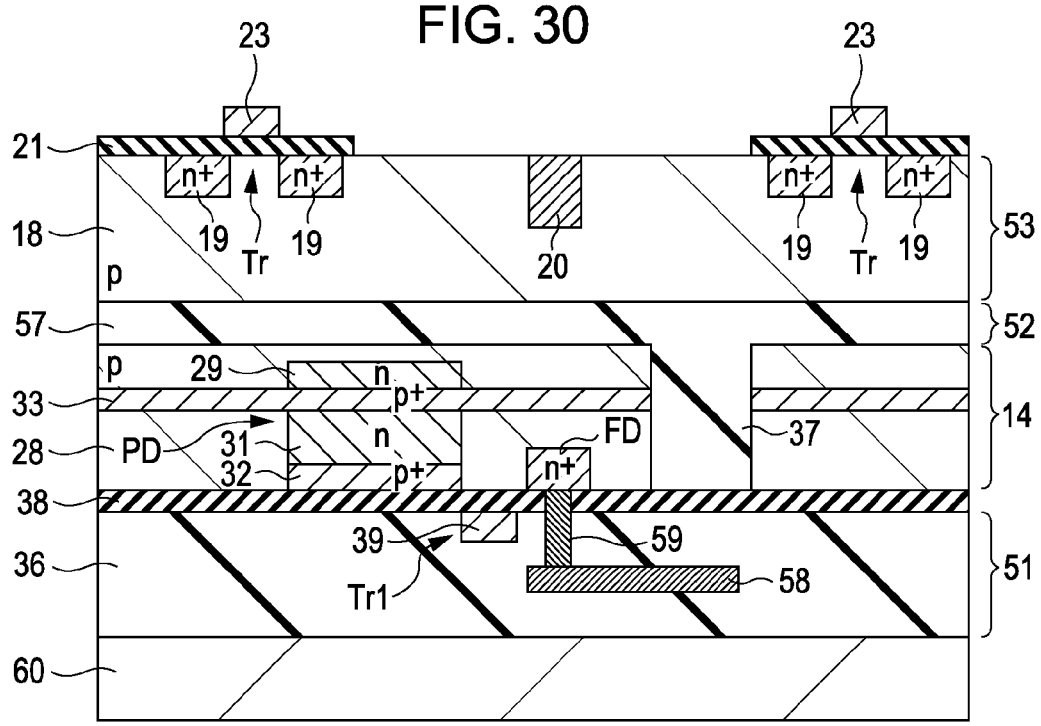
FIG. 30 shows a fourth step of the manufacturing method for the solid-state imaging device according to the third embodiment.

Then, as shown in FIG. 30, an element separation region 20 is formed in the first substrate 53 in the same method as the method in the first embodiment and the second embodiment. Also, desired pixel transistors Tr are formed by forming gate electrodes 23 on the first substrate 53 via a gate insulation film 21 and then forming source/drain regions 19 using the gate electrodes 23 as masks.

In forming impurity regions, such as the source/drain regions 19, on the first substrate 53, a high temperature is applied for ion implantation and impurity activation (annealing) as is normally performed. In the embodiment, the second wiring layer 51 has already been formed below the first substrate 53 in the step of FIG. 30. However, the wire 58 and the contact portion 59 in the second wiring layer are formed from tungsten, which is a high-melting point metal material, and therefore it is possible to use about as high a temperature as is necessary for impurity activation. That is, it is possible to perform ion implantation and impurity activation after the wiring layer.

Figure 31:
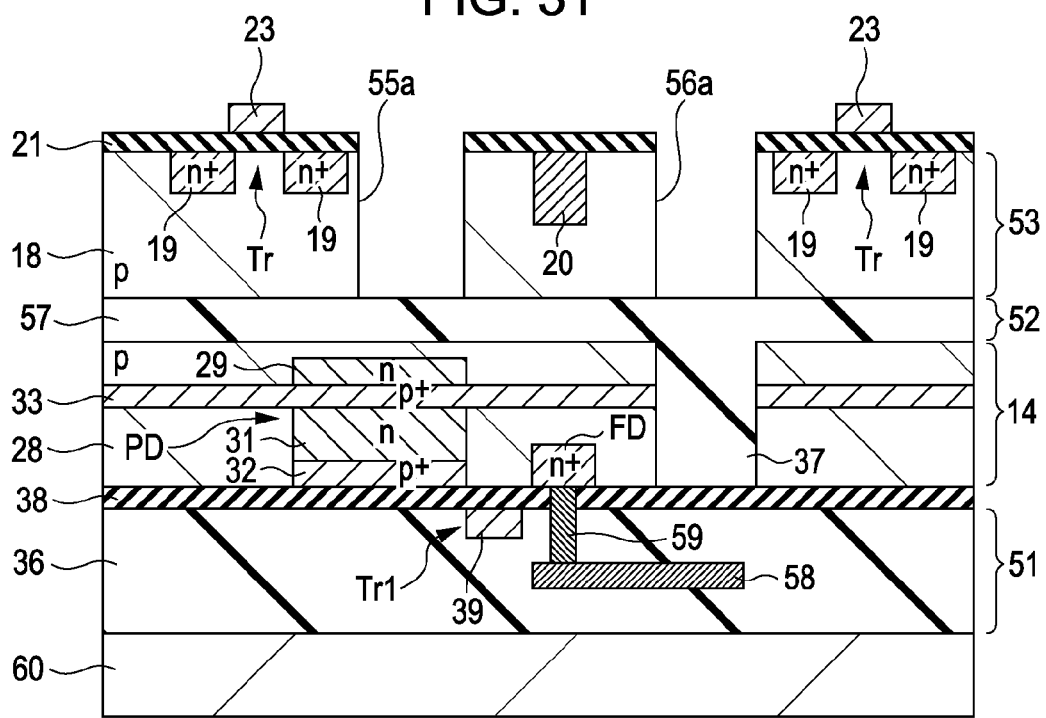
FIG. 31 shows a fifth step of the manufacturing method for the solid-state imaging device according to the third embodiment.

After the pixel transistors Tr are formed on the first substrate 53, as shown in FIG. 31, the gate insulation film 21 and the first substrate 53 are etched to form openings 55a and 56a through which the insulation layer 57 is exposed. The openings 55a and 56a are formed at desired positions. In the embodiment, the openings 55a and 56a are respectively formed in a portion above the overflow drain region 29 in the second substrate 14 and in a portion above the intra-substrate insulation layer 37 in the second substrate 14.

Figure 32:
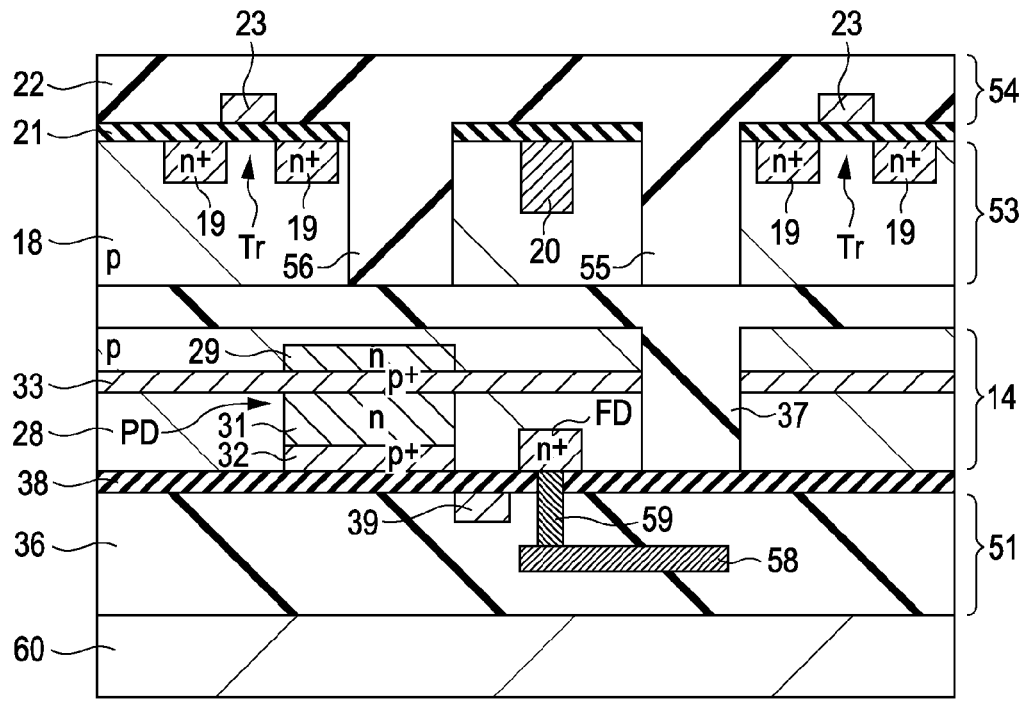
FIG. 32 shows a sixth step of the manufacturing method for the solid-state imaging device according to the third embodiment.

Then, as shown in FIG. 32, an insulation film such as a silicon oxide film, for example, is embedded into the openings 55a and 56a to form intra-substrate insulation layers 55 and 56. Thereafter, a silicon oxide film or the like is formed to cover the back surface (in this step, the front surface) of the first substrate 53 in order to form an interlayer insulation film 22 of a first wiring layer 54.

Figure 33:
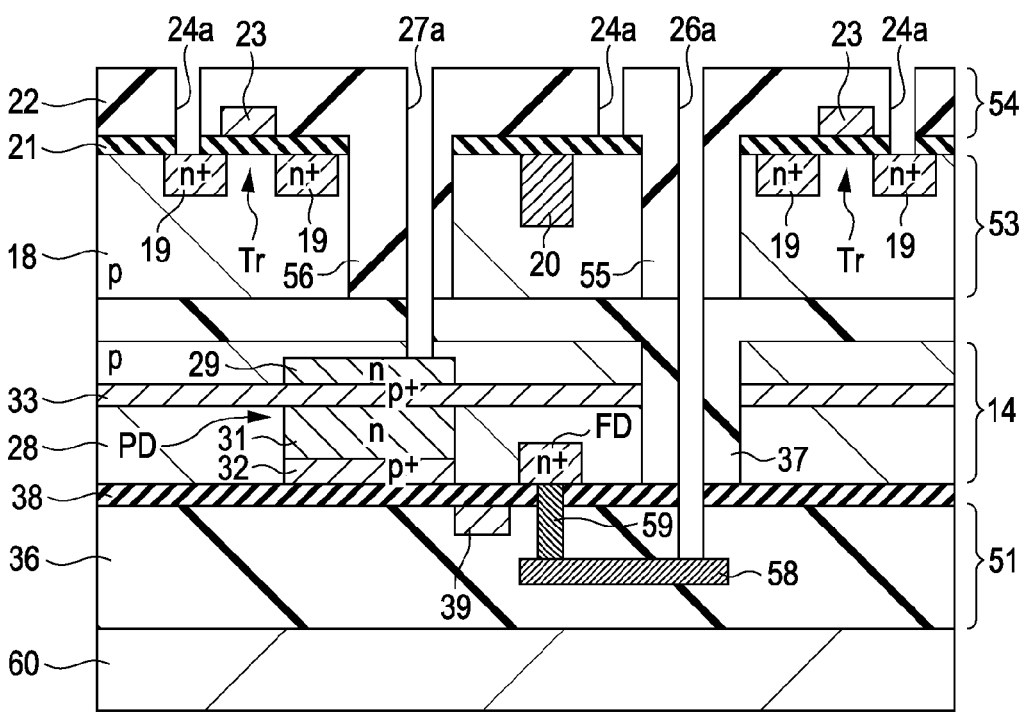
FIG. 33 shows a seventh step of the manufacturing method for the solid-state imaging device according to the third embodiment.

Then, as shown in FIG. 33, contact holes are formed at desired positions by etching the interlayer insulation film 22 from the upper surface. In this step, contact holes 24a through which the first substrate 53 is exposed and contact holes (not shown) through which the gate electrodes 23 of the pixel transistors Tr formed on the first substrate 53 are exposed are formed, for example. In addition, a contact hole 27a which is deep enough to penetrate through the intra-substrate insulation layer 56 and reach the overflow drain region 29 in the second substrate 14 and a contact hole 26a which is deep enough to penetrate through the intra-substrate insulation layers 55 and 37 and reach the wire 58 in the second wiring layer 51 are formed.

Figure 34:
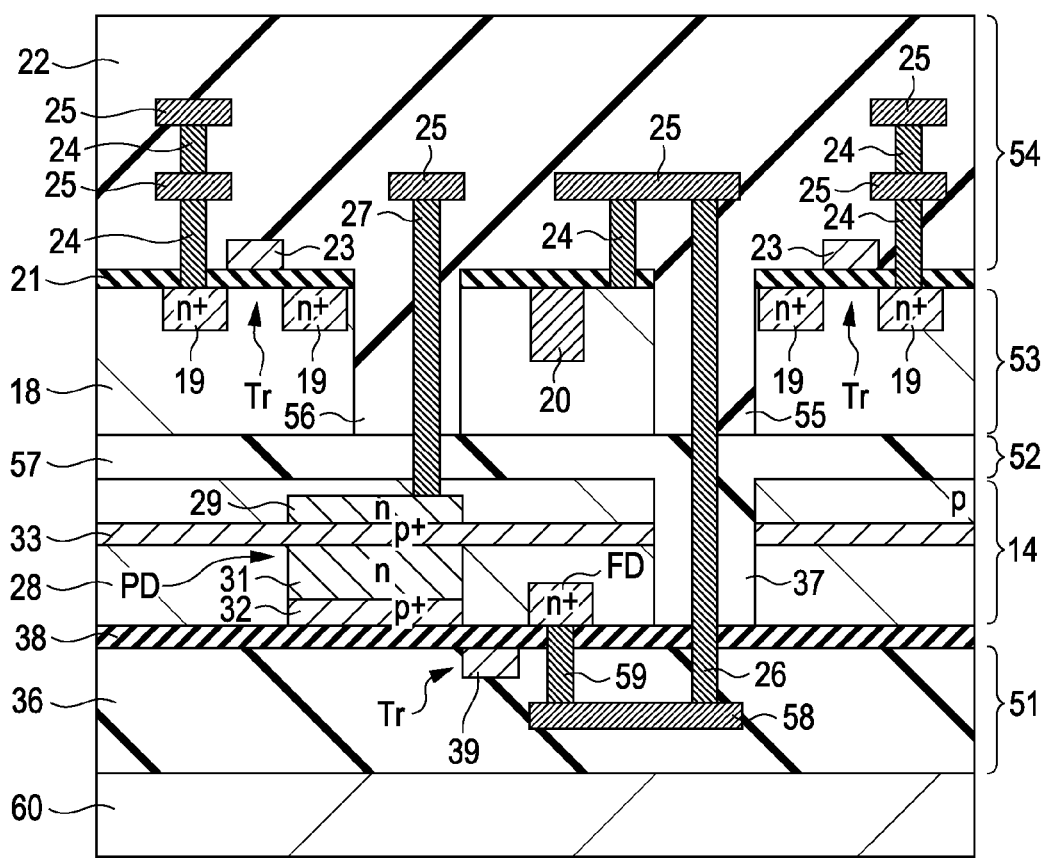
FIG. 34 shows an eighth step of the manufacturing method for the solid-state imaging device according to the third embodiment.

Then, as shown in FIG. 34, a metal material such as tungsten, for example, is embedded into the contact holes 24a, 26a, and 27a to form contact portions 24, 26, and 27. Thereafter, wires 25 made of a metal material such as aluminum or copper, for example, are formed on top of the contact portions 24, 26, and 27. Thereafter, the interlayer insulation film 22, the contact portions 24, and the wires 25 are iteratively formed to complete the first wiring layer 54.

Figure 35:
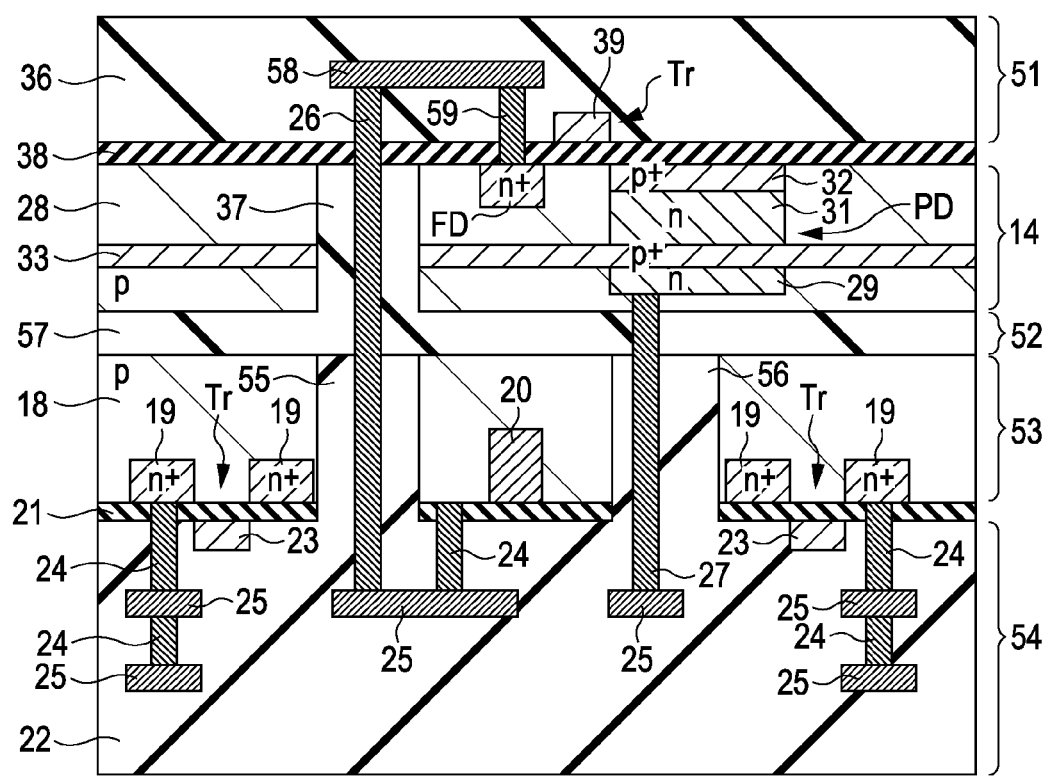
FIG. 35 shows a ninth step of the manufacturing method for the solid-state imaging device according to the third embodiment.

After the first wiring layer 54 is completed, the assembly is inverted again as shown in FIG. 35 to remove the support substrate 60, which has been attached to the top of the second wiring layer 51, using a grinding process, a CMP process, or the like.

Thereafter, although not shown, a color filter layer 16 and an on-chip microlens 17 are formed on top of the second wiring layer 51 by a normally employed method, which completes the solid-state imaging device 50 shown in FIG. 26.

In the manufacturing method for the solid-state imaging device 50 according to the embodiment, the contact portion 59 and the wire 58 in the second wiring layer 51, which are formed in a step before the pixel transistors Tr are formed on the first substrate 53, are formed from tungsten which is a high-melting point metal material. Therefore, it is possible to form the source/drain regions 19 of the pixel transistors Tr using a high-temperature process after the second wiring layer 51 is formed.

<4. Fourth Embodiment>
[4-1 Cross-Sectional Configuration of Main Portion]

Figure 36:
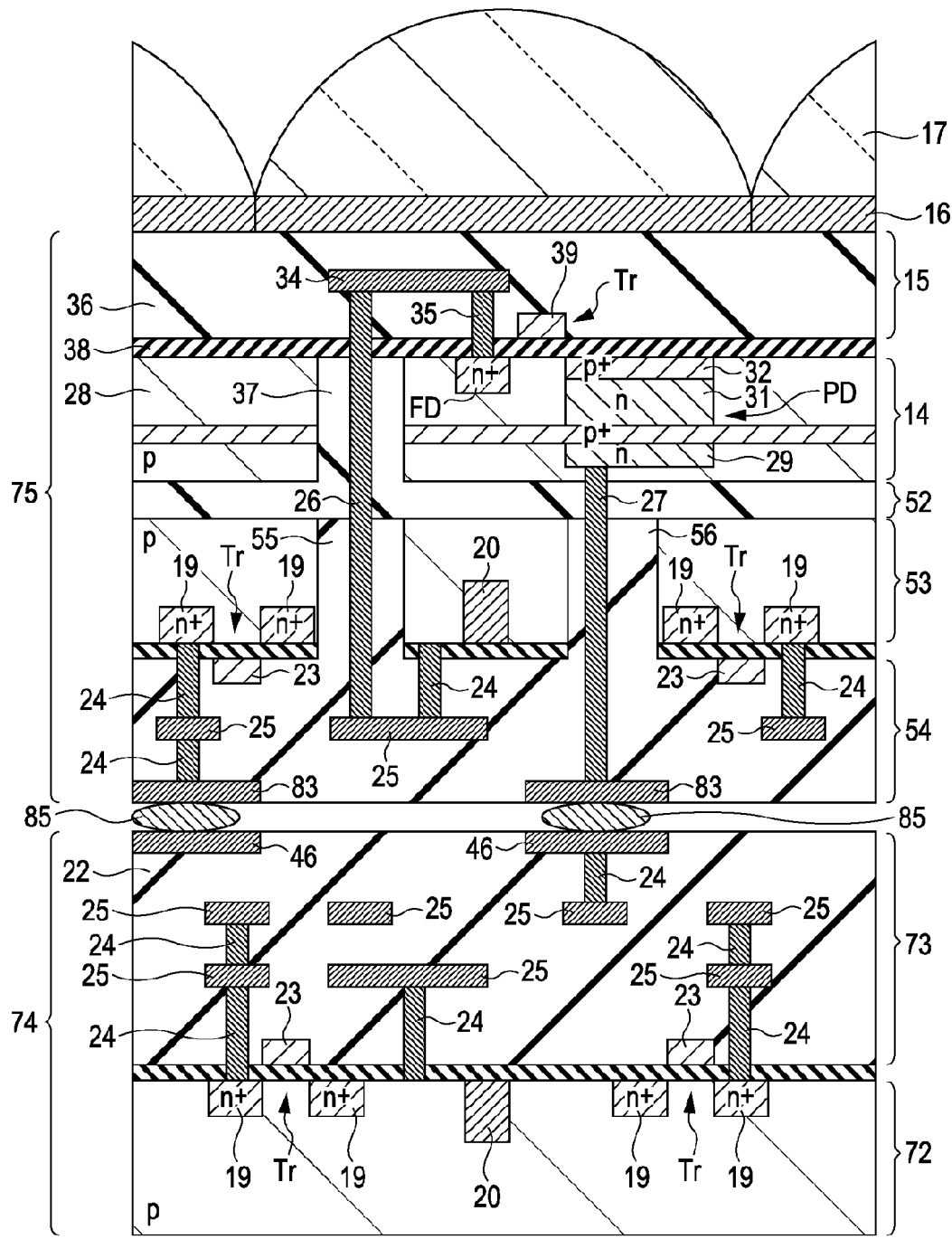
FIG. 36 is a cross-sectional view showing a schematic configuration of a pixel section of a solid-state imaging device according to a fourth embodiment.

FIG. 36 is a cross-sectional view showing a schematic configuration of a pixel section of a solid-state imaging device 70 according to a fourth embodiment. The overall configuration of the solid-state imaging device 70 and the circuit configuration of each pixel according to the embodiment are the same as the configurations shown in FIGS. 1 and 2, and thus redundant description will be omitted. Also, components in FIG. 36 corresponding to the components in FIG. 26 are denoted by the same reference symbols to omit redundant description. In the solid-state imaging device 70 according to the embodiment, three layers of substrates are stacked via a wiring layer or an insulation layer.

As shown in FIG. 36, the solid-state imaging device 70 according to the embodiment has a three-dimensional structure in which a third wiring layer 73 and a third substrate 72 are further stacked below the solid-state imaging device 50 according to the third embodiment.

In the first wiring layer 54 according to the embodiment, micropads 83 are formed in the first wiring layer 54. The third wiring layer 73 and the third substrate 72 have the same configuration as the first wiring layer 43 and the first substrate 12 in the solid-state imaging device 40 according to the second embodiment. It should be noted that the micropads 46 in the third wiring layer 73 are formed at positions matching the positions of the micropads 83 formed in the first wiring layer 54 above the third wiring layer 73.

The third substrate 72 and the third wiring layer 73 are collectively referred to as a "first element 74". Also, the first wiring layer 54, the first substrate 53, the insulation layer 52, the second substrate 14, and the second wiring layer 15 are collectively referred to as a "second element 75".

In the solid-state imaging device 70 according to the embodiment, the micropads 46 formed on top of the third wiring layer 73 and the micropads 83 formed on the bottom of the first wiring layer 54 are connected through microbumps 85. This allows the second element 75 to be stacked on the first element 74 with desired wires connected to each other via contact portions and the microbumps.

Thus, also in the case where three layers of substrates are stacked three-dimensionally, the contact portion 27 may be connected to the overflow drain region 29 in the second substrate 14, in which the light sensing section PD is formed, from the back-surface side of the second substrate 14.

In the solid-state imaging device 70 according to the embodiment, the second element 75 is formed by forming the micropads 83 on top of the first wiring layer 54 in the step of FIG. 34, and the first element 74 is formed in the same step as the step of FIG. 17. Thereafter, the first element 74 and the second element 75 are bonded to each other through the microbumps 85 to be stacked.

By stacking two or more layers of substrates via a wiring layer or an insulation layer as described above, it is possible to form a solid-state imaging device with a three-dimensional structure. This allows the pixel transistors Tr and other signal processing circuits to be stacked, which further reduces the size of the device.

In the first to fourth embodiments discussed above, the present invention is applied to CMOS solid-state imaging devices with an overflow structure to implement the electronic shutter function. However, the present invention is not limited to application to solid-state imaging devices with an overflow structure.

A case where the present invention is applied to fixation of the potential of a well region will be described below.

<5. Fifth Embodiment>
[5-1 Cross-Sectional Configuration of Main Portion]

Figure 37:
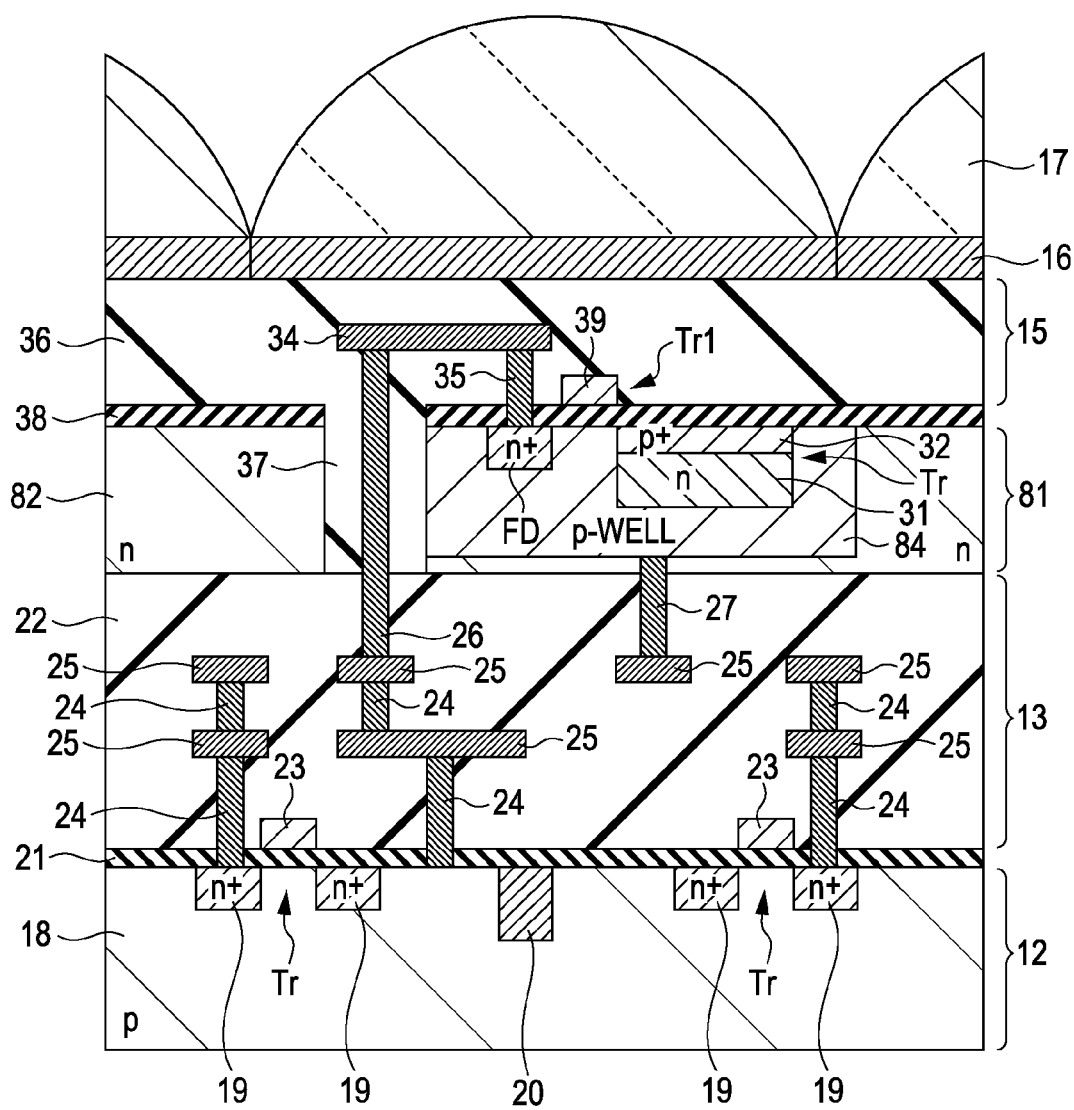
FIG. 37 is a cross-sectional view showing a schematic configuration of a pixel section of a solid-state imaging device according to a fifth embodiment.

FIG. 37 is a cross-sectional view showing a schematic configuration of a pixel section of a solid-state imaging device 80 according to a fifth embodiment. The overall configuration of the solid-state imaging device 80 and the circuit configuration of each pixel according to the embodiment are the same as the configurations shown in FIGS. 1 and 2, and thus redundant description will be omitted. Also, components in FIG. 37 corresponding to the components in FIG. 3 are denoted by the same reference symbols to omit redundant description. The solid-state imaging device 80 according to the embodiment is different from the solid-state imaging device 1 according to the first embodiment in configuration of the second substrate 14.

In the solid-state imaging device 80 according to the embodiment, a second substrate 81 is formed by an n-type semiconductor substrate 82. The light sensing section PD and the floating diffusion node FD are formed in a well region 84 formed by a p-type impurity region formed to extend from the front surface of the second substrate 81 in the depth direction.

The contact portion 27 extending from the wire 25 in the first wiring layer 13, which is disposed on the back-surface side of the second substrate 81, is connected to the well region 84. In the solid-state imaging device 80 according to the embodiment, a desired voltage is supplied from the wire 25 in the first wiring layer 13 to the well region 84 via the contact portion 27 to fix the potential of the well region 84.

The solid-state imaging device 80 according to the embodiment may be formed using the manufacturing method according to the first embodiment. In this case, in the formation step for the second substrate 81, a well region is formed by bonding an n-type semiconductor substrate 82 onto a first wiring layer 13 and then doping a p-type impurity by ion implantation from the front surface of the semiconductor substrate 82 to the upper end of the contact portion 27. Thereafter, a light sensing section PD and a floating diffusion node FD are formed to form a second substrate 81 in the same way as in the first embodiment.

According to the embodiment, also, it is possible to form the contact portion 27 which allows fixation of the potential of the well region 84 without reducing the light reception area in the solid-state imaging device 80 with a three-dimensional structure.

The configuration of the second substrate 81 according to the embodiment may also be applied to the solid-state imaging devices according to the second to fourth embodiments.

<6. Sixth Embodiment>

[6-1 Cross-Sectional Configuration of Main Portion]

Figure 38:
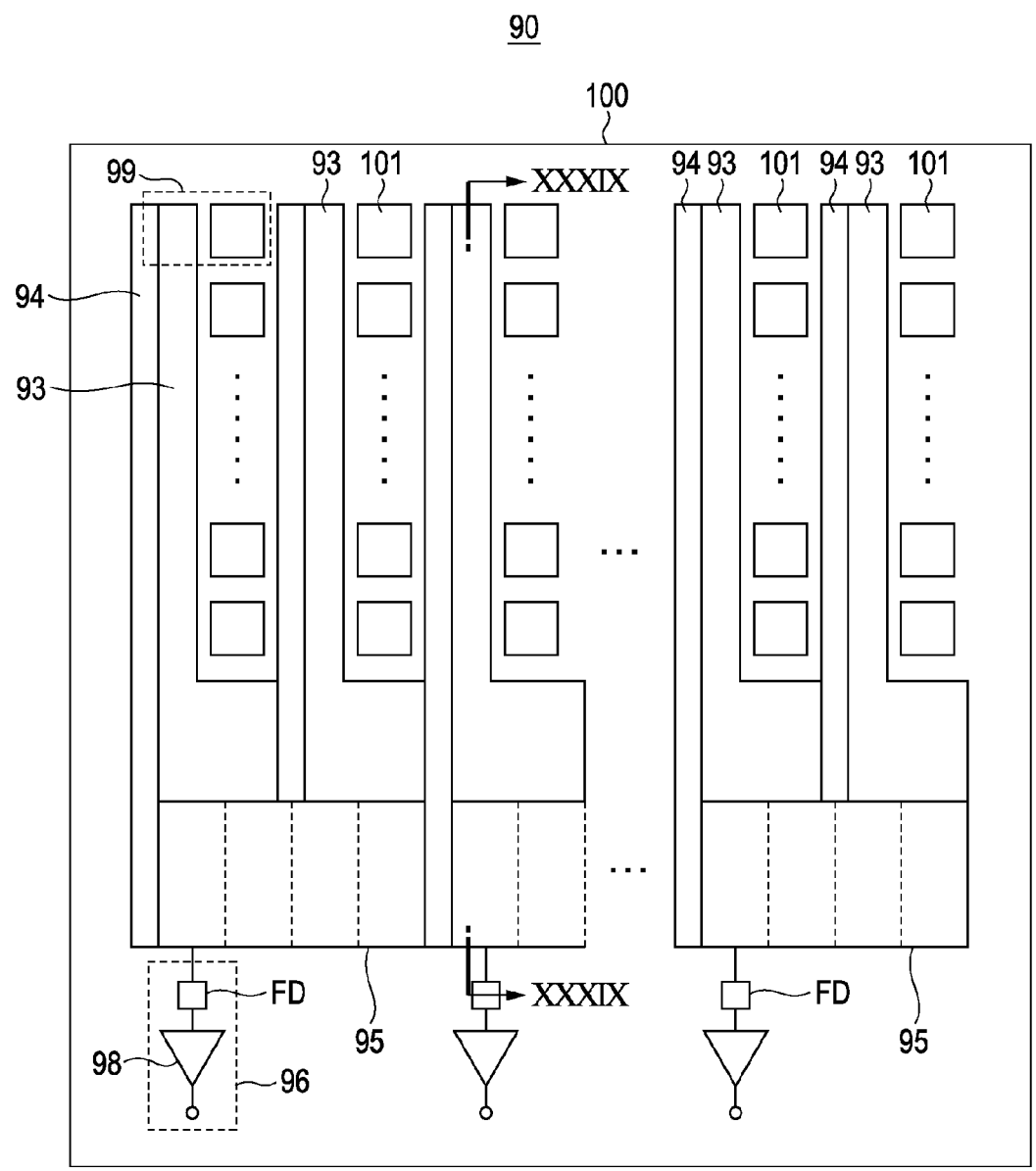
FIG. 38 shows a schematic overall configuration of a CCD solid-state imaging device according to a sixth embodiment of the present invention.

FIG. 38 shows a schematic overall configuration of a CCD solid-state imaging device 90 according to a sixth embodiment of the present invention.

As shown in FIG. 38, the solid-state imaging device 90 according to the embodiment includes a plurality of light sensing sections 101 formed on a substrate 100, vertical transfer resistors 93, horizontal transfer resistors 95, and output circuits 96. A unit pixel 99 is composed of each light sensing section 101 and a vertical transfer resistor 93 adjacent to the light sensing section 101. A pixel section is formed by a plurality of pixels 99.

The light sensing sections 101 are each formed by a photodiode. The plurality of light sensing sections 101 are arranged in the horizontal direction and the vertical direction of the substrate 100 to form a matrix. The light sensing sections 101 perform photoelectric conversion in accordance with incident light to generate and accumulate a signal charge.

The vertical transfer resistors 93 each have a CCD structure. The plurality of vertical transfer resistors 93 are arranged in the vertical direction on one side of the light sensing sections 101 arranged in the vertical direction. The vertical transfer resistors 93 read out the signal charge accumulated in the light sensing sections 101 to transfer the signal charge in the vertical direction. A transfer stage in which the vertical transfer resistors 93 are formed according to the embodiment are driven in four phases, for example, by a transfer pulse applied from a transfer drive pulse circuit (not shown). When a transfer pulse is applied to the final stage of the vertical transfer resistor 93, the signal charge held in the final stage is transferred to the horizontal transfer resistor 95. Element separation regions 94 are formed on the other side of the light sensing sections 101 arranged in the vertical direction. Therefore, the signal charge generated by the light sensing section 101 is read out only by the vertical transfer resistor 93 formed on the one side.

The horizontal transfer resistors 95 each have a CCD structure, and are formed at one end of the final stage of the vertical transfer resistors 93. A transfer stage in which the horizontal transfer resistors 95 are formed transfers in the horizontal direction the signal charge transferred from the vertical transfer resistors 93 in the vertical direction. In the embodiment, the horizontal transfer resistors 95 for every two columns of the light sensing sections 101 are separated from the horizontal transfer resistors 95 for two adjacent columns of the light sensing sections 101 by the element separation regions 94. Therefore, the horizontal transfer resistors 95 transfer in the horizontal direction the signal charge transferred from the light sensing sections 101 for two columns. While the horizontal transfer resistors 95 for every two columns of the light sensing sections 101 are separated from the horizontal transfer resistors 95 for two adjacent columns of the light sensing sections 101 by the element separation regions 94 in the embodiment, the horizontal transfer resistors 95 for each column or three or more columns of the light sensing sections 101 may be separated from the horizontal transfer resistors 95 for an adjacent column or three or more adjacent columns of the light sensing sections 101.

The output circuits 96 are formed at the final stage of the horizontal transfer resistors 95 separated into a plurality of blocks by the element separation regions 94. In the output circuits 96, the signal charge transferred from the horizontal transfer resistors 95 in the horizontal direction is transferred to a floating diffusion node FD, and variations in potential of the floating diffusion node FD are amplified by an output amplifier 98. Then, a pixel signal obtained as a result of amplification performed by the output amplifier 98 is output to the outside.

Thus, the solid-state imaging device 90 according to the embodiment has a multi-channel output configuration in which the output circuits 96 are provided for respective columns of unit pixels.

In the solid-state imaging device 90 configured as described above, the signal charge generated by and accumulated in the light sensing sections 101 is transferred in the vertical direction by the vertical transfer resistors 93 into the horizontal transfer resistors 95. The signal charge transferred into the horizontal transfer resistors 95 is then transferred in the horizontal direction to be output via the output circuits 96 as a pixel signal.

[5-2 Cross-Sectional Configuration of Main Portion]

Figure 39:
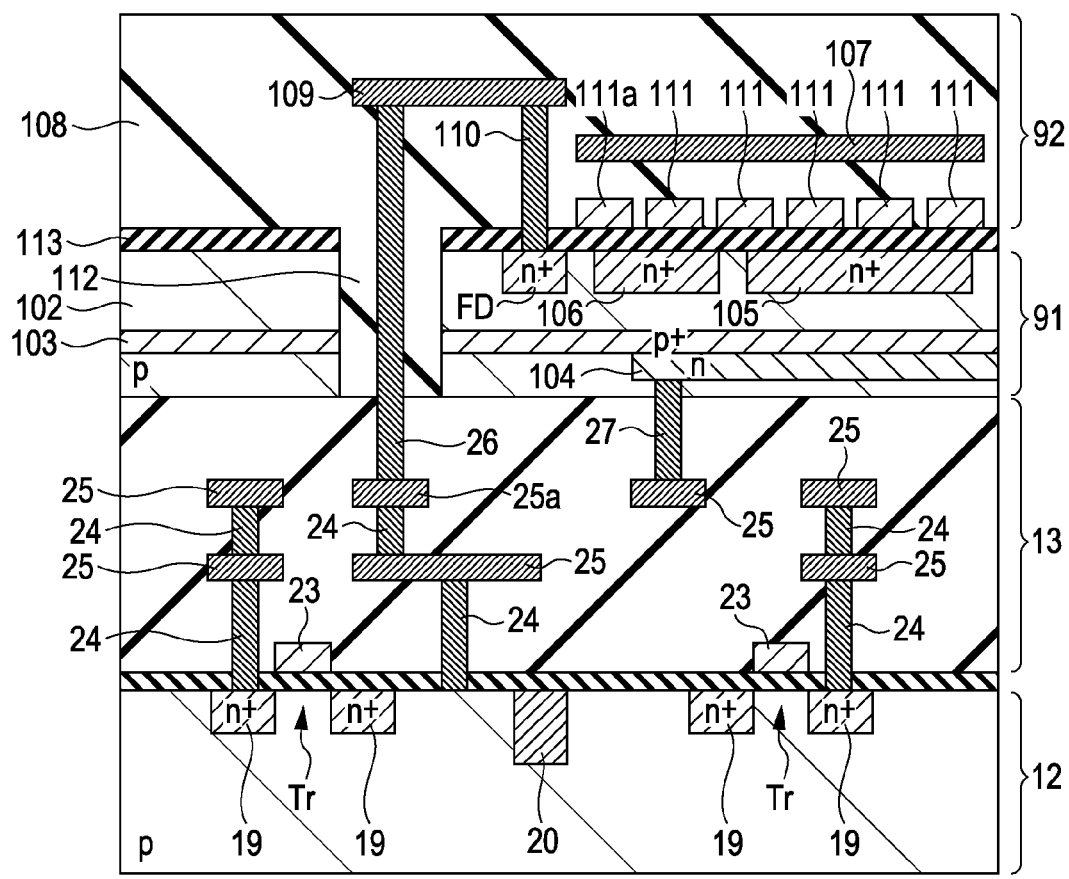
FIG. 39 is a cross-sectional view showing a schematic configuration taken along the line XXXIX-XXXIX of FIG. 38.

FIG. 39 is a cross-sectional view showing a schematic configuration taken along the line XXXIX-XXXIX of FIG. 38. That is, the drawing shows a cross section of a region including the vertical transfer resistors 93 for one column, the horizontal transfer resistor 95, and the floating diffusion node FD. Components in FIG. 39 corresponding to the components in FIG. 3 are denoted by the same reference symbols to omit redundant description.

As shown in FIG. 39, the solid-state imaging device 90 according to the embodiment has a three-dimensional structure in which the first substrate 12, the first wiring layer 13, a second substrate 91, and a second wiring layer 92 are stacked in this order toward the light incident side. While a color filter layer and an on-chip microlens are formed on top of the second wiring layer 92 on the light incident side in the solid-state imaging device 90 according to the embodiment as in the solid-state imaging devices according to the first to fifth embodiments, such components are not shown in FIG. 39.

The first substrate 12 and the first wiring layer 13 have the same configuration as those in the solid-state imaging device 1 according to the first embodiment.

The second substrate 91 is formed by a p-type semiconductor substrate 102, and is formed to be stacked on top of the first wiring layer 13. A vertical transfer channel 105 forming the vertical transfer resistors 93, a horizontal transfer channel 106 forming the horizontal transfer resistor 95, and the floating diffusion node FD which reads out a signal charge are formed in the second substrate 91 on the front-surface side (light incident-surface side). Although not shown, a light sensing section with the same configuration as the light sensing section PD according to the first embodiment is formed for each pixel in the second substrate 91. The vertical transfer channel 105, the horizontal transfer channel 106, and the floating diffusion node FD are each formed by an n-type heavily doped impurity region.

Further, an overflow barrier 103 made of a p-type heavily doped impurity region is formed below a region where each channel is formed all over the second substrate 91. An overflow drain region 104 made of an n-type impurity region is formed on the bottom of the overflow barrier 33. Thus, in the second substrate 91 according to the embodiment, a pnpn junction is formed from the front-surface side to the back-surface side in a portion where the light sensing section (not shown) is formed to form a vertical overflow structure. The thus formed vertical overflow structure allows an excessive signal charge overflowing from the light sensing section to be discharged through the overflow barrier 103 into the overflow drain region 104.

The contact portion 27 extending from the wire 25 in the first wiring layer 13 is connected to the overflow drain region 104 made of an n-type impurity region. In the embodiment, a desired potential (hereinafter referred to as an "electronic shutter pulse") is supplied from the wire 25 in the first wiring layer 13 to the overflow drain region 104 via the contact portion 27 to vary the potential of the overflow barrier 103. This allows the signal charge accumulated in the light sensing section to be discharged into the overflow drain region 104. That is, the electronic shutter function is provided by the vertical overflow structure formed in the second substrate 91 and the electronic shutter pulse supplied via the contact portion 27.

The second wiring layer 92 includes transfer electrodes 111 and an out gate electrode 111a formed on top of the second substrate 91 via an insulation film 113, and a wire 109 and a light shielding film 107 formed above the electrodes via an interlayer insulation film 108. A plurality of vertical transfer electrodes, of the transfer electrodes 111, are formed in the vertical direction above the vertical transfer channel 105 to form the vertical transfer resistors 93 shown in FIG. 38. Also, a plurality of horizontal transfer electrodes, of the transfer electrodes 111, are formed in the horizontal direction above the horizontal transfer channel 106 to form the horizontal transfer resistors 95 shown in FIG. 38. The out gate electrode 111a is formed between the horizontal transfer channel 106 and the floating diffusion node FD, and is configured to read out the signal charge transferred through the horizontal transfer channel 106 and to output the signal charge to the floating diffusion node FD.

The wire 109 in the second wiring layer 92 is connected to the floating diffusion node FD via a contact portion 110. The wire 109 is connected to the wire 25a formed in the first wiring layer 13 by a contact portion 26 formed in an intra-substrate insulation layer 112 formed to penetrate through the second substrate 91. With the wire 25a in the first wiring layer 13 and the wire 109 in the second wiring layer 92 connected by the contact portion 26, the potential of the floating diffusion node FD is supplied to the pixel transistors Tr formed in the first substrate 12, for example.

The light shielding film 107 is formed from a metal material, for example, and is formed above the vertical transfer resistors 93 and the horizontal transfer resistors 95 rather than the light sensing sections.

The solid-state imaging device 90 according to the embodiment may provide the same effect as the effect provided by the first embodiment. By applying the present invention to CCD solid-state imaging devices as described above, it is possible to support multi-channel output and implement an independent electronic shutter for each pixel without increasing the substrate area. Also, it is possible to implement other functions, such as A/D conversion, on a substrate as a lower layer (first substrate).

The solid-state imaging device 90 according to the embodiment may be formed using the manufacturing method for the solid-state imaging device 1 described in relation to the first embodiment.

As described above, the present invention is applicable not only to CMOS solid-state imaging devices but also to CCD solid-state imaging devices. In addition, the CMOS solid-state imaging devices described in relation to the second to fourth embodiments are also applicable to CCD solid-state imaging devices.

In the first to sixth embodiments discussed above, n-channel MOS transistors are mainly used. However, p-channel MOS transistors may also be used. In this case, the conductive types indicated in the drawings are inverted.

The present invention is not limited to application to solid-state imaging devices that detect distribution of the amount of incident visible light to capture images, and is also applicable to solid-state imaging devices that detect distribution of incident infrared rays, X-rays, particles, or the like to capture images. In addition, the present invention is generally applicable to solid-state imaging devices (physical amount distribution detection devices) in a broader sense, such as a fingerprint detection sensor, that detect distribution of other types of physical amount, such as a pressure or a capacitance, to capture images.

Further, the present invention is not limited to application to solid-state imaging devices in which unit pixels of a pixel section are sequentially scanned row by row to read out a pixel signal from the unit pixels. Rather, the present invention is also applicable to X-Y addressing solid-state imaging devices in which a desired pixel is selected pixel by pixel to read out a signal pixel by pixel from the selected pixel.

The solid-state imaging devices may be provided in the form of a single chip, or may be provided in the form of a module with an imaging function in which a pixel section and a signal processing section or an optical system are packaged integrally.

The present invention is not limited to application to solid-state imaging devices, and is also applicable to imaging devices. The term "imaging device" as used herein refers to camera systems such as digital still cameras and video cameras, and to electronic devices with an imaging function such as cellular phones. Modules mounted in the electronic devices, namely camera modules, may also be referred to as imaging devices.

<7. Seventh Embodiment: Electronic Device>

Figure 40:
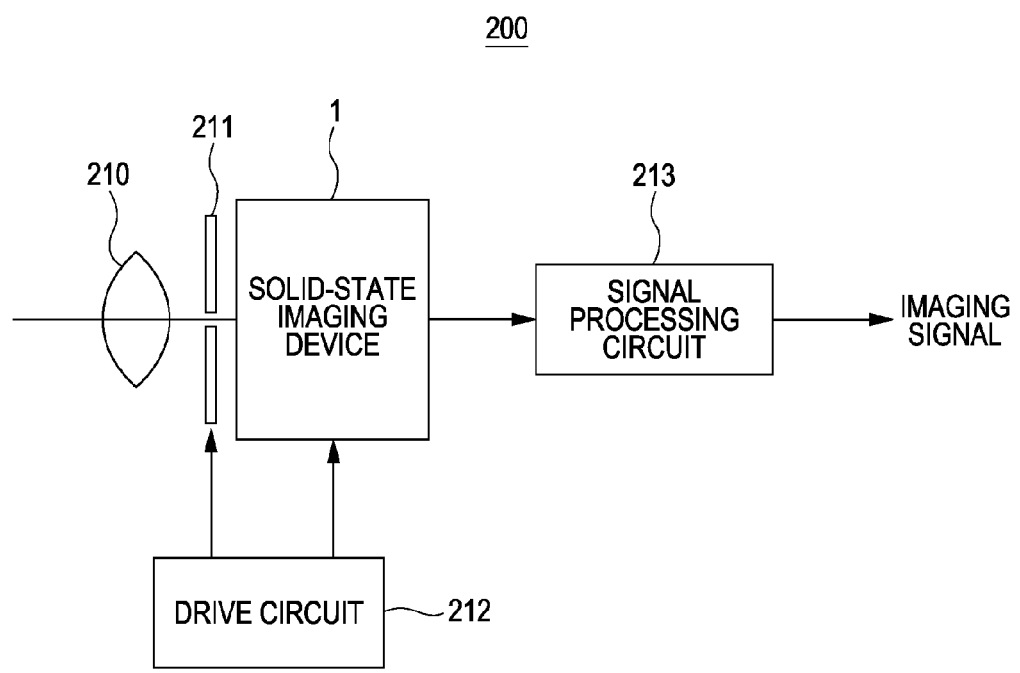
FIG. 40 shows a schematic configuration of an electronic device according to a seventh embodiment of the present invention.

Next, an electronic device according to a seventh embodiment of the present invention will be described. FIG. 40 shows a schematic configuration of an electronic device 200 according to the seventh embodiment of the present invention.

In the electronic device 200 according to the embodiment, the solid-state imaging device 1 according to the first embodiment of the present invention discussed above is used in an electronic device (camera).

The electronic device 200 according to the embodiment includes the solid-state imaging device 1, an optical lens 210, a shutter device 211, a drive circuit 212, and a signal processing circuit 213.

The optical lens 210 forms an image on an imaging surface of the solid-state imaging device 1 in accordance with image light (incident light) from a subject. This allows the solid-state imaging device 1 to accumulate a signal charge generated by the light sensing sections for a certain period.

The shutter device 211 controls a light irradiation period and a light shielding period for the solid-state imaging device 1.

The drive circuit 212 supplies a drive signal for controlling transfer operation of the solid-state imaging device 1 and shutter operation of the shutter device 211. The drive signal (timing signal) supplied from the drive circuit 212 causes the solid-state imaging device 1 to transfer a signal. The signal processing circuit 213 performs various signal processing. A video signal obtained as a result of the signal processing is stored in a storage medium such as a memory, or output to a monitor.

In the electronic device 200 according to the embodiment, the solid-state imaging device 1 employs a three-dimensional structure in which a plurality of substrates are stacked. Therefore, the size of the solid-state imaging device 1 is reduced, which is advantageous in reducing the size of the electronic device 200.

The electronic device 200 to which the solid-state imaging device 1 is applicable is not limited to cameras, and may be imaging devices such as digital still cameras and camera modules for mobile devices such as cellular phones.

In the embodiment, the solid-state imaging device 1 is used in an electronic device. However, any of the solid-state imaging devices according to the second to sixth embodiments discussed above may also be used.

The present application contains subject matter related to that disclosed in Japanese Priority Patent Application JP 2009-198118 filed in the Japan Patent Office on Aug. 28, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a first substrate and a second substrate, wherein the first substrate and the second substrate are stacked in vertical relation to one another;
   a wiring layer disposed in between the first substrate and the second substrate;
   a light sensing section formed in the second substrate, wherein the light sensing section is disposed on a light incident side of the second substrate and generates a signal charge in accordance with an amount of received light;
   a non-light incident-surface formed on a side of the substrate opposite the light incident side of the second substrate;
   an overflow drain region formed in the second substrate, wherein excess signal charge can be directed to the overflow drain region;
   an overflow barrier formed in the second substrate, wherein the overflow barrier is disposed between the overflow drain region and the light sensing section formed in the second substrate; and
   a contact member connected to the non-light incident-surface formed on the second substrate, wherein the contact member supplies a desired voltage to the overflow barrier from a wire in the wiring layer, and wherein the desired voltage supplied from the contact member causes the overflow barrier to allow signal charge to flow from the light sensing section to the overflow drain region.

2. The solid-state imaging device according to claim 1, wherein a vertical overflow structure that allows the signal charge generated by the light sensing section to be discharged is formed in the second substrate to extend from the light incident-surface side to the non-light incident-surface side of the second substrate.

3. The solid-state imaging device according to claim 2, further comprising:
   a floating diffusion node formed in the second substrate to read out the signal charge generated by the light sensing section; and
   a pixel transistor which is formed in the first substrate, and to which a potential of the floating diffusion node is supplied.

4. The solid-state imaging device according to claim 1, wherein the light sensing section is formed in a well region formed to extend in a depth direction from a surface of the second substrate, and the contact member is connected to the well region.

5. A manufacturing method for a solid-state imaging device comprising the steps of:
   stacking a first substrate in vertical relation to a second substrate, wherein a wiring layer is disposed in between the first substrate and the second substrate, wherein a light sensing section is formed in the second substrate on a light incident side of the second substrate, the light sensing section being configured to generate a signal charge in accordance with an amount of received light, and wherein a non-light incident-surface is formed on a side of the substrate opposite the light incident side of the second substrate;
   during the stacking step, forming:
      an overflow drain region in the second substrate, wherein excess signal charge can be directed to the overflow drain region;
      an overflow barrier in the second substrate, wherein the overflow barrier is disposed between the overflow drain region and the light sensing section formed in the second substrate; and
      a contact member connected to the non-light incident-surface formed on the second substrate, wherein the contact member supplies a desired voltage to the overflow barrier from a wire in the wiring layer, and wherein the desired voltage supplied from the contact member causes the overflow barrier to allow signal charge to flow from the light sensing section to the overflow drain region.

6. The manufacturing method for a solid-state imaging device according to claim 5, wherein a vertical overflow structure that allows the signal charge generated by the light sensing section to be discharged is formed in the second substrate extends from the light incident-surface side to the non-light incident-surface side of the second substrate.

7. The manufacturing method for a solid-state imaging device according to claim 6, wherein the plurality of substrates are stacked by bonding the substrates via the wiring layer.

8. The manufacturing method for a solid-state imaging device according to claim 6,
wherein the plurality of substrates are stacked by forming micropads in the wiring layer on the substrates and connecting the micropads formed in the wiring layer on the substrates through a microbump.

9. The manufacturing method for a solid-state imaging device according to claim 6,
wherein the step of stacking a plurality of substrates via a wiring layer includes the steps of:
forming a wiring layer with a wire made of a high-melting point metal material on the light incident side of the second substrate;
forming a different substrate via an insulation layer on the non-light incident side of the second substrate;
forming source/drain regions forming a desired pixel transistor in the first substrate; and
forming a wiring layer on the non-light incident side of the first substrate.

10. The manufacturing method for a solid-state imaging device according to claim 5,
wherein the light sensing section is formed in a well region formed to extend in a depth direction from a surface of the second substrate, and the contact portion is connected to the well region.

11. An electronic device comprising:
an optical lens;
a solid-state imaging device on which light collected by the optical lens is incident, the solid-state imaging device comprising:
a first substrate and a second substrate, wherein the first substrate and the second substrate are stacked in vertical relation to one another;
a wiring layer disposed in between the first substrate and the second substrate;
a light sensing section that is formed in the second substrate on a light incident side of the second substrate and generates a signal charge in accordance with an amount of received light;
a non-light incident-surface is formed on a side of the second substrate opposite the light incident side of the second substrate;
an overflow drain region formed in the second substrate, wherein excess signal charge can be directed to the overflow drain region;
an overflow barrier formed in the second substrate, wherein the overflow barrier is disposed between the overflow drain region and the light sensing section formed in the second substrate;
a contact member connected to the non-light incident-surface formed on the second substrate, wherein the contact member supplies a desired voltage to the overflow barrier from a wire in the wiring layer, and wherein the desired voltage supplied from the contact member causes the overflow barrier to allow signal charge to flow from the light sensing section to the overflow drain region; and
a signal processing circuit that processes an output signal output from the solid-state imaging device.

12. The electronic device according to claim 11,
wherein a vertical overflow structure that allows the signal charge generated by the light sensing section to be discharged is formed in the substrate in which the light sensing section is formed to extend from the light incident-surface side to the non-light incident-surface side of the substrate.

13. The electronic device according to claim 12,
wherein the solid-state imaging device further includes:
a floating diffusion node formed in the substrate in which the light sensing section is formed to read out the signal charge generated by the light sensing section; and
a pixel transistor which is formed in the first substrate and to which a potential of the floating diffusion node is supplied.

14. The electronic device according to claim 11,
wherein the light sensing section is formed in a well region formed to extend in a depth direction from a surface of the second substrate, and the contact portion is connected to the well region.

* * * * *